(12) United States Patent
Kouno et al.

(10) Patent No.: US 12,142,895 B2
(45) Date of Patent: Nov. 12, 2024

(54) SEMICONDUCTOR LASER DEVICE

(71) Applicant: NUVOTON TECHNOLOGY CORPORATION JAPAN, Kyoto (JP)

(72) Inventors: Keishi Kouno, Toyama (JP); Ryoji Hiroyama, Toyama (JP); Shinji Yoshida, Shiga (JP); Katsuya Samonji, Toyama (JP); Masanori Hiroki, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 814 days.

(21) Appl. No.: 17/331,128

(22) Filed: May 26, 2021

(65) Prior Publication Data

US 2021/0281038 A1    Sep. 9, 2021

Related U.S. Application Data

(63) Continuation-in-part of application No. PCT/JP2019/044934, filed on Nov. 15, 2019.

(30) Foreign Application Priority Data

Nov. 30, 2018  (JP) ................ 2018-225661

(51) Int. Cl.
*H01S 5/042* (2006.01)
*H01S 5/023* (2021.01)
(Continued)

(52) U.S. Cl.
CPC ............ *H01S 5/028* (2013.01); *H01S 5/023* (2021.01); *H01S 5/04252* (2019.08);
(Continued)

(58) Field of Classification Search
CPC .. H01S 5/023; H01S 5/04252; H01S 5/04256; H01S 5/22; H01S 5/3072
See application file for complete search history.

(56) References Cited

U.S. PATENT DOCUMENTS

2009/0262771 A1* 10/2009 Inoue ................. B82Y 20/00
    438/33
2011/0158275 A1    6/2011 Yoshizumi et al.
(Continued)

FOREIGN PATENT DOCUMENTS

JP    2005-109291 A    4/2005
JP    2006-013331 A    1/2006
(Continued)

OTHER PUBLICATIONS

Machine translation of WO2018/180524A1 (Year: 2018).*
(Continued)

*Primary Examiner* — Yuanda Zhang
(74) *Attorney, Agent, or Firm* — Rimon P.C.

(57) ABSTRACT

A semiconductor laser device includes: a semiconductor laminate body; an insulating layer disposed above the semiconductor laminate body and including a first opening extending in a first direction that is a direction from a front end surface toward a rear end surface; a first electrode disposed above the semiconductor laminate body; a second electrode disposed above the first electrode and the insulating layer; and an adhesion layer disposed between the second electrode and the insulating layer. The adhesion layer includes a second opening that at least partially overlaps with the first opening in plan view, the first electrode is at least partially disposed inside the first opening and the second opening, and the second electrode and the adhesion layer are disposed above the insulating layer between the first opening and at least one of the front end surface or the rear end surface.

29 Claims, 26 Drawing Sheets

(51) Int. Cl.
*H01S 5/028* (2006.01)
*H01S 5/22* (2006.01)
*H01S 5/30* (2006.01)
*H01S 5/34* (2006.01)

(52) U.S. Cl.
CPC ............ *H01S 5/04256* (2019.08); *H01S 5/22* (2013.01); *H01S 5/3072* (2013.01); *H01S 5/34* (2013.01)

(56) References Cited

U.S. PATENT DOCUMENTS

2011/0193126 A1* 8/2011 Oka .................... H01S 5/04252
438/39
2020/0144213 A1* 5/2020 Kainuma ................ H01L 24/30

FOREIGN PATENT DOCUMENTS

| JP | 2007027572 A | * | 2/2007 | ............. H01S 5/022 |
| JP | 2009-170708 A | | 7/2009 | |
| JP | 2011-135016 A | | 7/2011 | |
| WO | 2018/180524 A1 | | 10/2018 | |

OTHER PUBLICATIONS

International Search Report and Written Opinion issued in International Patent Application No. PCT/JP2019/044934, dated Feb. 10, 2020; with partial English translation.

* cited by examiner

SEMICONDUCTOR LASER DEVICE

CROSS REFERENCE TO RELATED APPLICATIONS

The present application is a continuation-in-part of PCT International Application No. PCT/JP2019/044934 filed on Nov. 15, 2019, designating the United States of America, which is based on and claims priority of Japanese Patent Application No. 2018-225661 filed on Nov. 30, 2018. The entire disclosures of the above-identified applications, including the specifications, drawings and claims are incorporated herein by reference in their entirety.

FIELD

The present disclosure relates to a semiconductor laser device.

BACKGROUND

Semiconductor laser devices have conventionally been known as small-sized, high-output light sources (see Patent Literature (PTL) 1, for example). In such semiconductor laser devices, a band-shaped ohmic electrode is formed along the optical axis of laser light, and a pad electrode is disposed above the ohmic electrode and an insulating layer formed in the vicinity of the ohmic electrode. In the semiconductor laser device disclosed in PTL 1, a bonding layer including, for example, a Ti layer is disposed between the pad electrode and the insulating layer. By increasing the bonding strength between the pad electrode and the insulating layer in this manner, PTL 1 is attempting to inhibit the pad electrode from peeling.

CITATION LIST

Patent Literature

PTL 1: Japanese Unexamined Patent Application Publication No. 2006-13331

SUMMARY

Technical Problem

In manufacturing semiconductor laser devices as disclosed in PTL 1, first, bar-shaped elements are formed by cleaving a wafer on which a laminate structure including, for example, a semiconductor layer, an ohmic electrode, and a pad electrode is stacked. Subsequently, the bar-shaped elements are divided into chip-shaped elements to form semiconductor laser devices. The cleavage surfaces resulting from the mentioned cleavage serve as end surfaces that form a laser resonator. With the semiconductor laser device disclosed in PTL 1, the pad electrode located at the cleavage surface may peel at the time of cleavage.

In view of the above circumstances, the present disclosure provides a semiconductor laser device capable of inhibiting the electrode from peeling.

Solution to Problem

To address the above circumstances, a semiconductor laser device according to an aspect of the present disclosure is a semiconductor laser device that emits laser light, the semiconductor laser device including: a semiconductor laminate body including an active layer that generates the laser light; an insulating layer disposed above the semiconductor laminate body; a first electrode disposed above the semiconductor laminate body; a second electrode disposed above the first electrode and the insulating layer; and an adhesion layer disposed between the second electrode and the insulating layer. In the semiconductor laser device, the semiconductor laminate body includes a front end surface through which the laser light is emitted, and a rear end surface opposite the front end surface, the insulating layer includes a first opening extending in a first direction that is a direction from the front end surface toward the rear end surface, the adhesion layer includes a second opening that at least partially overlaps with the first opening in a plan view of the adhesion layer, the first electrode is at least partially disposed inside the first opening and the second opening in the plan view of the adhesion layer, and the second electrode and the adhesion layer are disposed above the insulating layer between the first opening and at least one of the front end surface or the rear end surface.

As described above, since the second electrode and the adhesion layer are disposed above the insulating layer between the first opening and at least one of the front end surface or the rear end surface, it is possible to enhance the adhesion (that is, the bonding strength) between the second electrode and the insulating layer at the at least one of the front end surface or the rear end surface. It is thus possible to inhibit the second electrode from peeling at the front end surface and the rear end surface.

In the semiconductor laser device according to an aspect of the present disclosure, the second electrode need not include Ti.

In the semiconductor laser device according to an aspect of the present disclosure, an electrical conductivity of the second electrode may be greater than an electrical conductivity of the adhesion layer.

Accordingly, it is possible to achieve a greater reduction in the resistance value of the semiconductor laser device than when the electrical conductivity of the second electrode is less than or equal to the electrical conductivity of the adhesion layer.

In the semiconductor laser device according to an aspect of the present disclosure, the second electrode may be in contact with the first electrode.

This way, it is possible to achieve a greater reduction in the resistance value of the semiconductor laser device than when another component is interposed between the first electrode and the second electrode.

In the semiconductor laser device according to an aspect of the present disclosure, the second electrode need not be in contact with the at least one of the front end surface or the rear end surface.

This way, it is possible to inhibit the second electrode from peeling at at least one of the end surfaces.

In the semiconductor laser device according to an aspect of the present disclosure, in the plan view of the adhesion layer, a perimeter of the second electrode may be at least partially located (i) inside a perimeter of the adhesion layer and (ii) outside a perimeter of the first opening and a perimeter of the second opening.

This way, the adhesion layer is disposed between the perimeter of the second electrode and the insulating layer, thus making it possible to inhibit the second electrode from peeling at its perimeter.

In the semiconductor laser device according to an aspect of the present disclosure, in the plan view of the adhesion layer, an edge of the second opening adjacent to one end surface among the front end surface and the rear end surface may be located between the one end surface and an edge of the first opening adjacent to the one end surface.

This way, it is possible to dispose the first electrode up to the edge of the first opening closest to the end surface, without the adhesion layer and the first electrode coming into contact with one another. Accordingly, it is possible to maximize the area size of the first electrode in the vicinity of the end surfaces.

In the semiconductor laser device according to an aspect of the present disclosure, in the plan view of the adhesion layer, an edge of the second opening adjacent to a side end surface of the semiconductor laminate body in a second direction may be located between the side end surface and an edge of the first opening adjacent to the side end surface, the second direction being perpendicular to the first direction.

This way, it is possible to dispose the first electrode up to the edges of the first opening closest to the side end surfaces, without the adhesion layer and the first electrode coming into contact with one another. Accordingly, it is possible to maximize the area size of the first electrode in the vicinity of the side end surfaces.

In the semiconductor laser device according to an aspect of the present disclosure, in the plan view of the adhesion layer, all edges of the second opening may be located outside the first opening.

This way, it is possible to dispose the first electrode up to the edges of the first opening, without the adhesion layer and the first electrode coming into contact with one another. Accordingly, it is possible to maximize the area size of the first electrode in the vicinity of the side end surfaces.

In the semiconductor laser device according to an aspect of the present disclosure, in the plan view of the adhesion layer, each of edges of the second opening may be located (i) inside a perimeter of the first opening or (ii) on the perimeter of the first opening.

This way, it is possible to increase the area of contact between the adhesion layer and the second electrode. Accordingly, it is possible to further inhibit the second electrode from peeling.

In the semiconductor laser device according to an aspect of the present disclosure, the adhesion layer may include at least one of Ti or Cr.

This way, it is possible to enhance the adhesion between the adhesion layer and the insulating layer when the insulating layer is an oxide.

In the semiconductor laser device according to an aspect of the present disclosure, the semiconductor laminate body may include a p-type semiconductor layer disposed between the active layer and the first electrode.

When the first electrode of a semiconductor laser device having the above-described configuration includes a p-type ohmic electrode, it is possible to inhibit a rise in the operating voltage during laser operation, by disposing the adhesion layer including Ti not to be in contact with the first electrode.

In the semiconductor laser device according to an aspect of the present disclosure, the first electrode need not include Ti.

This way, it is possible to inhibit a rise in the operating voltage during laser operation of the semiconductor laser device.

In the semiconductor laser device according to an aspect of the present disclosure, an electrical conductivity of the first electrode may be greater than an electrical conductivity of the adhesion layer.

Accordingly, it is possible to achieve a greater reduction in the resistance value of the semiconductor laser device than when the electrical conductivity of the first electrode is less than or equal to the electrical conductivity of the adhesion layer.

In the semiconductor laser device according to an aspect of the present disclosure, the first electrode may be an ohmic electrode.

In the semiconductor laser device according to an aspect of the present disclosure, the first electrode may include at least one of Pd, Pt, Ni, or Al.

This way, the first electrode can have favorable ohmic characteristics.

In the semiconductor laser device according to an aspect of the present disclosure, the adhesion layer need not be in contact with the first electrode.

This way, it is possible to inhibit a rise in the operating voltage during laser operation of the semiconductor laser device.

In the semiconductor laser device according to an aspect of the present disclosure, the semiconductor laminate body may include a ridge portion, and in the plan view of the adhesion layer, an upper surface of the ridge portion may be at least partially disposed inside the first opening.

In the semiconductor laser device according to an aspect of the present disclosure, the second electrode may be a pad electrode.

This enables easy bonding of a power supply wire to the second electrode.

The semiconductor laser device according to an aspect of the present disclosure may further include a submount joined to the second electrode.

With this, it is possible to efficiently dissipate heat generated in, for example, the active layer. Accordingly, the adverse effect of the heat in the active layer can be reduced.

In the semiconductor laser device according to an aspect of the present disclosure, the second electrode may include an alloy containing Au.

With use of such a second electrode, the semiconductor laminate body can be more favorably mounted on the submount.

In the semiconductor laser device according to an aspect of the present disclosure, the submount may include an end surface intersecting with the first direction, and in the plan view of the adhesion layer, the end surface may be located between the front end surface and the first opening.

This way, it is possible to inhibit the submount from scattering laser light emitted from the front end surface, while ensuring the heat dissipation from the semiconductor laminate body to the submount.

Advantageous Effects

The present disclosure can provide a semiconductor laser device capable of inhibiting an electrode from peeling.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
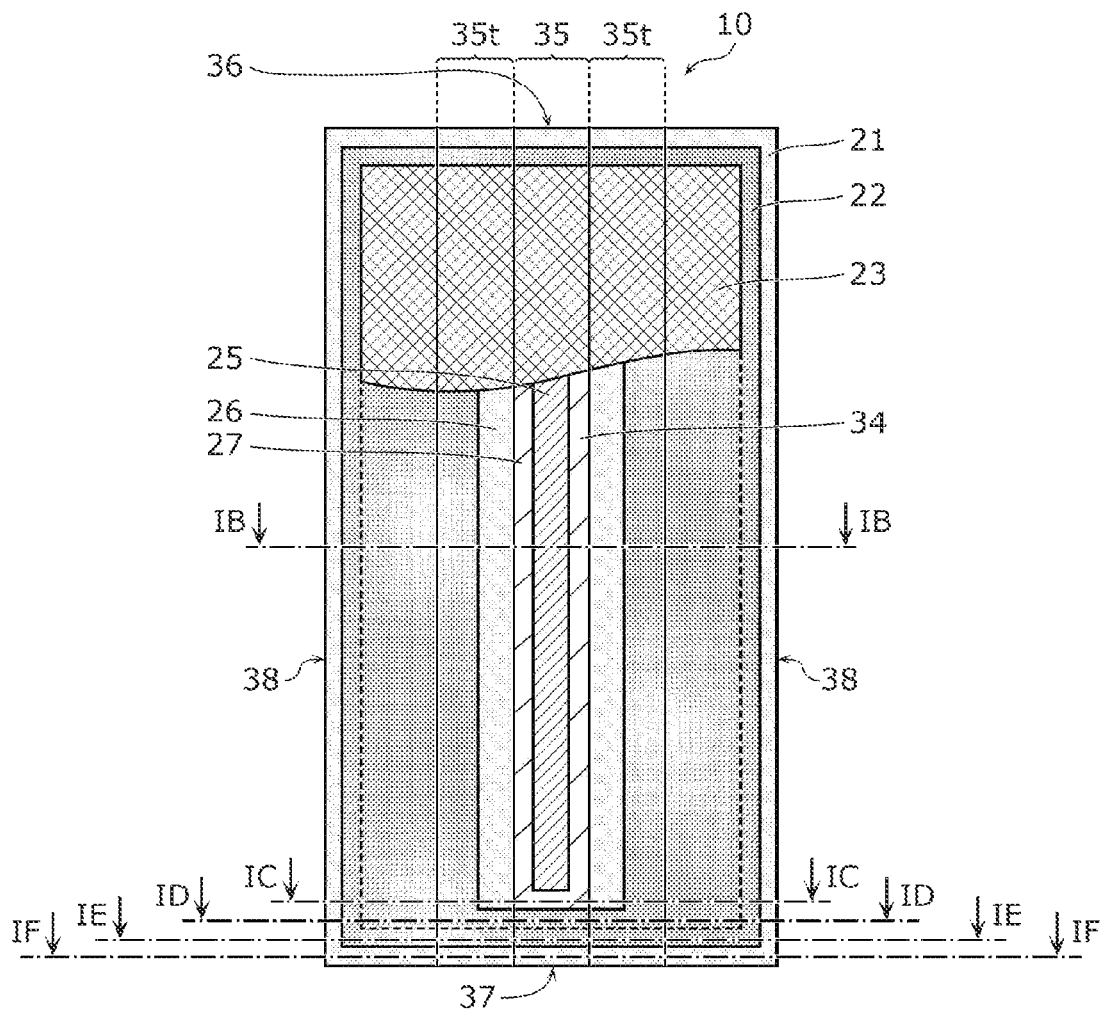
FIG. 1A is a plan view schematically illustrating an overall configuration of a semiconductor laser device according to Embodiment 1.

Hereinafter, embodiments of the present disclosure will be described with reference to the accompanying drawings. Note that the embodiments described below each illustrate a specific example of the present disclosure. Therefore, the numerical values, shapes, materials, constituent elements, the arrangement and connection of the constituent elements, etc. illustrated in the embodiments below are mere examples, and are not to limit the present disclosure. As such, among the constituent elements in the embodiments described below, constituent elements not recited in any of the independent claims representing the most generic concepts of the present disclosure will be described as optional constituent elements.

The drawings are represented schematically and are not necessarily precise illustrations. Thus, the scales etc. of the drawings are not necessarily precise. In the drawings, essentially the same constituent elements are given the same reference signs, and overlapping descriptions thereof are omitted or simplified.

Furthermore, in the Specification, the terms "upper", "above", "upward", "lower", and "below" do not refer to the upward direction (vertically upward) or the downward direction (vertically downward) in the sense of absolute space recognition, but are defined by the relative positional relationship based on the stacking order of a laminate structure. In addition, the terms "upper", "above", "lower", and "below" are applied not only when two constituent elements are disposed apart from each other and there is another constituent element between the two constituent elements, but also when two constituent elements are disposed in contact with each other.

Embodiment 1

The following describes a semiconductor laser device according to Embodiment 1.
[1-1. Overall Configuration]
First, an overall configuration of the semiconductor laser device according to the present embodiment will be described with reference to the drawings. FIG. 1A is a plan view schematically illustrating an overall configuration of semiconductor laser device 10 according to the present embodiment. In FIG. 1A, second electrode 23 is partially cut out to show the configuration of, for example, adhesion layer 22. The cut-out part of second electrode 23 is illustrated with a dashed line to show the outline only. FIG. 1B to FIG. 1F are cross-sectional views illustrating the overall configuration of semiconductor laser device 10 according to the present embodiment. FIG. 1B, FIG. 1C, FIG. 1D, FIG. 1E, and FIG. 1F respectively illustrate cross sections taken at the IB-IB line, the IC-IC line, the ID-ID line, the IE-IE line, and the IF-IF line shown in FIG. 1A.

Figure 1B:
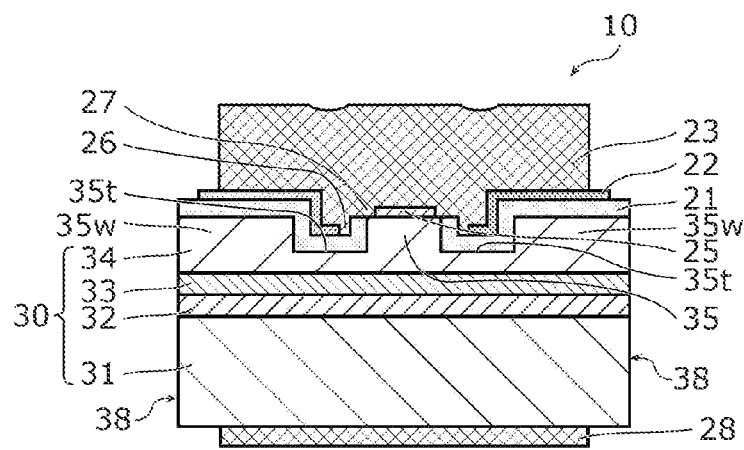
FIG. 1B is a first cross-sectional view schematically illustrating the overall configuration of the semiconductor laser device according to Embodiment 1.

Semiconductor laser device 10 is a device that emits laser light. As illustrated in FIG. 1B, semiconductor laser device 10 includes semiconductor laminate body 30, insulating layer 21, first electrode 25, second electrode 23, adhesion layer 22, and n-side electrode 28.

As illustrated in FIG. 1A, semiconductor laminate body 30 includes front end surface 36 through which laser light is emitted and rear end surface 37 that is opposite front end surface 36. As illustrated in FIG. 1B etc., semiconductor laminate body 30 includes active layer 33 that generates laser light. As illustrated in FIG. 1B, semiconductor laminate body 30 includes ridge portion 35. Semiconductor laminate body 30 further includes substrate 31, n-type semiconductor layer 32, and p-type semiconductor layer 34. Note that one or more other layers may be interposed between the above-mentioned layers of semiconductor laminate body 30.

Table 1 below shows an example of specific configurations of the main layers forming semiconductor laser device 10. The specific configuration of each layer is a mere example, and the material, thickness, impurity concentration, number of layers, etc. can be altered as appropriate.

TABLE 1

|  |  | Material | Thickness [nm] | Impurity concentration [cm$^{-3}$] |
|---|---|---|---|---|
| Second electrode 23 |  | Au | 1600 |  |
| First electrode 25 |  | Pt | 35 |  |
|  |  | Pd | 40 |  |
| P-type semiconductor layer 34 | P-type contact layer | p$^+$-GaN | 10 | $2.00 \times 10^{20}$ |
|  |  | p-GaN | 50 | $2.00 \times 10^{19}$ |
|  | P-type clad layer | p-AlGaN | 409 | $1.00 \times 10^{19}$ |
|  |  | p-AlGaN | 250 | $2.00 \times 10^{18}$ |
|  | Electron block layer | p-AlGaN | 1 | $1.50 \times 10^{19}$ |
|  |  | p-AlGaN | 5 | $1.50 \times 10^{19}$ |
|  | P-side guide layer | GaN | 3 | $1.50 \times 10^{19}$ |
|  |  | GaN | 6 | Undoped |
|  |  | InGaN | 40 | Undoped |
| Active layer 33 | Barrier layer | InGaN | 18 | Undoped |
|  | Well layer | InGaN | 7.5 | Undoped |
|  | Barrier layer | InGaN | 19 | Undoped |
|  | Well layer | InGaN | 7.5 | Undoped |
|  | Barrier layer | InGaN | 92 | Undoped |
| N-type semiconductor layer 32 | N-side guide layer | GaN | 127 | $5.00 \times 10^{17}$ |
|  | N-type clad layer | AlGaN | 3000 | $5.00 \times 10^{17}$ |
| Substrate 31 |  | GaN | 85000 | $1.40 \times 10^{18}$ |
| N-side electrode 28 |  | Ti | 10 |  |
|  |  | Pt | 35 |  |
|  |  | Au | 300 |  |

Substrate 31 is a component serving as the base of semiconductor laser device 10. In the present embodiment, substrate 31 includes n-type GaN. The thickness of substrate 31 is, for example, at least 50 μm and at most 150 μm. Substrate 31 has a group-IV n-type impurity added thereto. The group-IV n-type impurity is Si, for example. Note that the group-IV n-type impurity included in substrate 31 may be Ge, for example. As shown in Table 1, the impurity concentration (specifically, the Si concentration) of substrate 31 is $1.40 \times 10^{18}$ cm$^{-3}$, for example.

N-type semiconductor layer 32 is an example of a semiconductor layer of a first conductivity type disposed above substrate 31. N-type semiconductor layer 32 includes, for example, an n-type clad layer (not illustrated) including n-type AlGaN and an n-side guide layer (not illustrated) including n-type GaN.

The n-type clad layer is provided between substrate 31 and the n-side guide layer, in contact with each of substrate 31 and the n-side guide layer. The n-type clad layer is, for example, an AlGaN layer having a thickness of 3 μm as shown in Table 1. The composition ratio of Al is 2.6%, for example. The n-type clad layer has Si, an example of the group-IV n-type impurity, added thereto. The impurity concentration of the n-type clad layer is lower than the impurity concentration of substrate 31, and is $5.00 \times 10^{17}$ cm$^{-3}$, for example.

The n-side guide layer is provided between the n-type clad layer and active layer 33, in contact with each of the n-type clad layer and active layer 33. The n-side guide layer is, for example, a GaN layer having a thickness of 127 nm as shown in Table 1. The n-side guide layer has Si, an example of the group-IV n-type impurity, added thereto. The impurity concentration of the n-side guide layer is equal to the impurity concentration of the n-type clad layer and lower than the impurity concentration of substrate 31, and is $5.00 \times 10^{17}$ cm$^{-3}$, for example.

Active layer 33 is a light emission layer that is disposed above n-type semiconductor layer 32 and that generates laser light. In the present embodiment, active layer 33 has a multi quantum well structure. Specifically, active layer 33 includes a plurality of well layers and a plurality of barrier layers alternately laminated one by one. More specifically, as shown in Table 1, active layer 33 includes two well layers and three barrier layers. Each of the two well layers is an undoped InGaN layer having a thickness of 7.5 nm. The composition ratio of In in the well layers is adjusted to make the oscillation wavelength 405 nm. Each of the three barrier layers is an undoped $In_{0.08}Ga_{0.92}N$ layer, and the thicknesses thereof are different from one another as shown in Table 1.

P-type semiconductor layer 34 is an example of a semiconductor layer having a second conductivity type different from the first conductivity type and disposed between active layer 33 and first electrode 25. In the present embodiment, p-type semiconductor layer 34 is doped with Mg and includes H. P-type semiconductor layer 34 includes a p-side guide layer, an electron block layer, a p-type clad layer, and a p-type contact layer (none of these layers is illustrated).

The p-side guide layer is provided between active layer 33 and the electron block layer, in contact with each of active layer 33 and the electron block layer. The p-side guide layer has, for example, a laminate structure including an undoped InGaN layer having a thickness of 40 nm, an undoped GaN layer having a thickness of 6 nm, and a p-type GaN layer having a thickness of 3 nm as shown in Table 1. The composition ratio of In of the undoped InGaN layer is 0.3%, for example. The p-type GaN layer is an example of a p-type nitride-based semiconductor layer, and has Mg added thereto as a p-type impurity. The impurity concentration of the p-type GaN layer is higher than the impurity concentration of substrate 31, and is $1.50 \times 10^{19}$ cm$^{-3}$, for example.

The electron block layer blocks electrons moving from active layer 33 to first electrode 25. By providing the electron block layer, electrons can be more efficiently injected to active layer 33, and the light emission efficiency can be enhanced. The electron block layer is provided between the p-side guide layer and the p-type clad layer, in contact with each of the p-side guide layer and the p-type clad layer. The electron block layer has, for example, a laminate structure including a plurality of p-type AlGaN layers as shown in Table 1. The plurality of p-type AlGaN layers are different from one another in thickness and composition ratio of Al. A p-type AlGaN layer in contact with the p-side guide layer (i.e., a p-type AlGaN layer located on the lower layer side) has a thickness of 5 nm, and its composition ratio of Al gradually increases from 4% to 36% in the direction from the p-side guide layer to the p-type clad layer. A p-type AlGaN layer in contact with the p-type clad layer (i.e., a p-type AlGaN layer located on the upper layer side) has a thickness of 1 nm, and its composition ratio of Al is 36%. The two p-type AlGaN layers have Mg added thereto as a p-type impurity. The impurity concentration of the p-type AlGaN layers is equal to the impurity concentration of the p-type GaN layer of the p-side guide layer, and is $1.50 \times 10^{19}$ cm$^{-3}$, for example.

The p-type clad layer is provided between the electron block layer and the p-type contact layer, in contact with each of the electron block layer and the p-type contact layer. The p-type clad layer has, for example, a laminate structure including a plurality of p-type AlGaN layers as shown in Table 1. The plurality of p-type AlGaN layers are different from one another in thickness and impurity concentration. The respective Al composition ratios of the plurality of p-type AlGaN layers are equal to one another, and are 2.6%, for example. The plurality of p-type AlGaN layers have Mg added thereto as a p-type impurity. The impurity concentration of a p-type AlGaN layer in contact with the electron block layer (i.e., a p-type AlGaN layer located on the lower layer side) is $2.00 \times 10^{18}$ cm$^{-3}$, for example. The impurity concentration of a p-type AlGaN layer in contact with the p-type contact layer (i.e., a p-type AlGaN layer located on the upper layer side) is higher than the impurity concentration of the p-type AlGaN layer in contact with the electron block layer and lower than the impurity concentration of the electron block layer, and is, for example, $1.00 \times 10^{19}$ cm$^{-3}$.

The p-type contact layer is provided between the p-type clad layer and first electrode 25, in contact with each of the p-type clad layer and first electrode 25. The p-type contact layer has, for example, a laminate structure including a plurality of p-type GaN layers as shown in Table 1. The plurality of p-type GaN layers are different from one another in thickness and impurity concentration. The plurality of p-type GaN layers have Mg added thereto as a p-type impurity. The impurity concentration of a p-type GaN layer in contact with the p-type clad layer (i.e., a p-type GaN layer located on the lower layer side) is higher than the impurity concentration of the p-type clad layer, and is, for example, $2.00 \times 10^{19}$ cm$^{-3}$. The impurity concentration of a p-type GaN layer in contact with first electrode 25 (i.e., a p-type GaN layer located on the upper layer side) is higher than the impurity concentration of the p-type GaN layer in contact with the p-type clad layer, and is, for example, $2.00 \times 10^{20}$ cm$^{-3}$. In other words, the p-type GaN layer in contact with first electrode 25 is doped with a p-type impurity at high concentration.

In the present embodiment, ridge portion 35 is formed in part of p-type semiconductor layer 34. In addition, as illustrated in FIG. 1B, protruding portions 35w equal to ridge portion 35 in height are formed in p-type semiconductor layer 34 along ridge portion 35 on both sides of ridge portion 35. Stated differently, p-type semiconductor layer 34 has grooves 35t that define ridge portion 35 and protruding portions 35w. Ridge portion 35 functions as a current constricting structure (that is, a current confining structure) and functions also as a waveguide of laser light. Note that although protruding portions 35w are formed in the present embodiment, protruding portions 35w need not be formed.

That is to say, ridge portion 35 may be the only part of the upper surface of p-type semiconductor layer 34 that protrudes upward. The height of ridge portion 35 is 680 nm, for example.

As illustrated in FIG. 1A, insulating layer 21 is a dielectric layer that: is formed in the entire region of the upper surface of semiconductor laminate body 30; has first opening 27 extending in a first direction which is a direction from front end surface 36 toward rear end surface 37; and is disposed above semiconductor laminate body 30. In other words, as illustrated in FIG. 1D to FIG. 1F, insulating layer 21 is disposed in a region that is: between first opening 27 and at least one of front end surface 36 or rear end surface 37; and above ridge portion 35 of semiconductor laminate body 30. Insulating layer 21 is also disposed in a region that is: between first opening 27 and side end surface 38 of semiconductor laminate body 30; and above semiconductor laminate body 30 (above grooves 35$t$ and protruding portions 35$w$). In a plan view of adhesion layer 22, the upper surface of ridge portion 35 is at least partially located inside first opening 27.

In the present embodiment, insulating layer 21 includes $SiO_2$. Note that the material included in insulating layer 21 is not limited to $SiO_2$. Insulating layer 21 may include: a spin on glass (SOG) material; phosphorus silicon glass (PSG); boron phosphorus silicon glass (BPSG); an oxide other than Si-based oxides such as $TiO_2$, $Ta_2O_5$, $Al_2O_3$, $ZrO_2$, $HfO_2$, $CeO_2$, $In_2O_3$, or $Nd_2O_5$; a nitride such as SiN or $Si_3N_4$; or an organic material such as polyimide. Note that if SiN is used for forming insulating layer 21, it is possible to obtain characteristics equivalent to those obtained when using $SiO_2$.

First electrode 25 is an electrode disposed above semiconductor laminate body 30. In the present embodiment, first electrode 25 is disposed above the upper surface of ridge portion 35 as illustrated in FIG. 1B. As illustrated in FIG. 1A, first electrode 25 is disposed in a region of the upper surface of ridge portion 35 other than front end surface 36, rear end surface 37, and the vicinities of front end surface 36 and rear end surface 37. First electrode 25 is disposed inside first opening 27 in a plan view of insulating layer 21. As illustrated in FIG. 1A and FIG. 1C to FIG. 1F, first electrode 25 is not disposed in a region between front end surface 36 and a position at a distance of 35 μm from front end surface 36 toward the center of the upper surface of semiconductor laminate body 30, nor in a region between rear end surface 37 and a position at a distance of 11 μm from rear end surface 37 toward the center of the upper surface of semiconductor laminate body 30. The perimeter of first opening 27 of insulating layer 21 is located outside the perimeter of first electrode 25 disposed on ridge portion 35, at a distance of at least 0.1 μm and less than 10 μm from the perimeter of first electrode 25.

First electrode 25 is an ohmic electrode having an ohmic contact with p-type semiconductor layer 34. The electrical conductivity of first electrode 25 is greater than the electrical conductivity of adhesion layer 22. Accordingly, it is possible to achieve a greater reduction in the resistance value of semiconductor laser device 10 than when the electrical conductivity of first electrode 25 is less than or equal to the electrical conductivity of adhesion layer 22.

First electrode 25 does not include Ti. This make it possible to inhibit a rise in the operating voltage during laser operation of semiconductor laser device 10. First electrode 25 includes at least one of Pd, Pt, Ni, or Al, for example.

In the present embodiment, first electrode 25 is provided in contact with the p-type contact layer. First electrode 25 has, for example, a laminate structure including a Pd film having a thickness of 40 nm and a Pt film having a thickness of 35 nm as shown in Table 1. The Pd film is located on the lower layer side, and is in contact with the p-type contact layer.

Second electrode 23 is an electrode disposed above first electrode 25 and insulating layer 21. The perimeter of second electrode 23 is located above insulating layer 21 between first opening 27 and at least one of front end surface 36 or rear end surface 37. Second electrode 23 is disposed not to be in contact with at least one of front end surface 36 or rear end surface 37. In the present embodiment, second electrode 23 is disposed not to be in contact with front end surface 36 nor rear end surface 37 as illustrated in FIG. 1A, FIG. 1E, and FIG. 1F. The perimeter of second electrode 23 is located at a distance of, for example, at least 0.1 μm and less than 20 μm from front end surface 36 and rear end surface 37. Specifically, second electrode 23 is disposed at a distance of 10 μm from front end surface 36, and at a distance of 10 μm from rear end surface 37. In addition, the perimeter of second electrode 23 is located at a distance of 7.6 μm from side end surfaces 38 of semiconductor laminate body 30. Second electrode 23 is a pad electrode. This enables easy bonding of a power supply wire to second electrode 23.

As illustrated in FIG. 1B, second electrode 23 is in contact with first electrode 25. This way, it is possible to achieve a greater reduction in the resistance value of the semiconductor laser device than when another component is interposed between the first electrode and the second electrode. The electrical conductivity of second electrode 23 is greater than the electrical conductivity of adhesion layer 22. Accordingly, it is possible to achieve a greater reduction in the resistance value of the semiconductor laser device than when the electrical conductivity of the second electrode is less than or equal to the electrical conductivity of the adhesion layer. Second electrode 23 does not include Ti. Second electrode 23 includes, for example, Au having a thickness of 1.6 μm as shown in Table 1.

Adhesion layer 22 is a layer disposed between second electrode 23 and insulating layer 21. Adhesion layer 22 has second opening 26 that at least partially overlaps with first opening 27 in a plan view of adhesion layer 22. In the present embodiment, in a plan view of adhesion layer 22, the long sides of the perimeter of first opening 27 are located inside second opening 26, and the short sides of the perimeter of first opening 27 are in agreement with the short sides of the perimeter of second opening 26. As illustrated in FIG. 1A, first electrode 25 is at least partially disposed inside first opening 27 and second opening 26 in a plan view of adhesion layer 22. This allows second electrode 23 to be in contact with first electrode 25 disposed inside first opening 27 and second opening 26. Note that in the present embodiment, the entirety of first electrode 25 is disposed inside first opening 27 and second opening 26 in a plan view of adhesion layer 22. As illustrated in FIG. 1D and FIG. 1E, adhesion layer 22 is disposed above insulating layer 21 (that is, insulating layer 21 disposed above ridge portion 35) between first opening 27 and at least one of front end surface 36 or rear end surface 37. Also, adhesion layer 22 is disposed above insulating layer 21 (that is, insulating layer 21 disposed above grooves 35$t$ and protruding portions 35$w$) between first opening 27 and side end surface 38 of semiconductor laminate body 30. In the present embodiment, adhesion layer 22 is disposed not to be in contact with front end surface 36 nor rear end surface 37 as illustrated in FIG. 1F. Specifically, the perimeter of adhesion layer 22 is located at a distance of at least 0.1 μm and less than 20 μm from at least one of front end surface 36 or rear end surface 37. The perimeter of second opening 26 is located outside the perimeter of first opening 27 in the first direction, at a distance of, for example, at least 0.1 μm and less than 10 μm from the perimeter of first opening 27. Specifically, the perimeter of second opening 26 is located at a distance of 2.8 μm from the perimeter of first opening 27 in the first direction. In the present embodiment, the perimeter of second opening 26 is located in grooves 35t at a distance of 2.8 μm from the perimeter of first opening 27 in the second direction. The perimeter of second opening 26 may be in agreement with the perimeter of first opening 27 in the second direction. The perimeter of adhesion layer 22 is located at a distance of 9 μm from front end surface 36 and at a distance of 9 μm from rear end surface 37 in the first direction. In addition, the perimeter of adhesion layer 22 is located at a distance of 6.6 μm from side end surfaces 38 of semiconductor laminate body 30 in the second direction. Adhesion layer 22 includes at least one of Ti or Cr. This make it possible to enhance the adhesion between adhesion layer 22 and insulating layer 21 when insulating layer 21 is an oxide. The adhesion between adhesion layer 22 and insulating layer 21 can be further enhanced when adhesion layer 22 includes Ti and insulating layer 21 includes $TiO_2$. It is because, when insulating layer 21 is an oxide and adhesion layer 22 containing a metal film is a material that easily forms an oxide, insulating layer 21 and adhesion layer 22 tightly bond with one another.

As illustrated in FIG. 1A, the perimeter of second electrode 23 is located inside the perimeter of adhesion layer 22 and outside second opening 26. Specifically, in the first direction: the perimeter of adhesion layer 22 is located at a distance of 9 μm from front end surface 36 and rear end surface 37; the perimeter of second electrode 23 is located at a distance of 10 μm from front end surface 36 and rear end surface 37; and the perimeter of second opening 26 is located at a distance of 37.8 μm from front end surface 36 and at a distance of 13.8 μm from rear end surface 37, and in the second direction: the perimeter of adhesion layer 22 is located at a distance of 6.6 μm from side end surfaces 38 of semiconductor laminate body 30; the perimeter of second electrode 23 is located at a distance of 7.6 μm from side end surfaces 38; and the perimeter of second opening 26 is located at a distance of 69 μm from side end surfaces 38. Accordingly, as illustrated in FIG. 1E, adhesion layer 22 is present but second opening 26 is not present in cross section IE-IE at a distance of at least 6.6 μm and at most 13.8 μm from rear end surface 37 in the first direction.

Adhesion layer 22 has, for example, a laminate structure including a Ti film having a thickness of 10 nm and a Pt film having a thickness of 50 nm. The Ti film is located on the lower layer side, and is in contact with insulating layer 21.

N-side electrode 28 is an example of an n-side electrode that is in contact with substrate 31. N-side electrode 28 is disposed on the back surface of substrate 31 (that is, a surface of substrate 31 opposite the surface thereof on which n-type semiconductor layer 32 etc. is formed). N-side electrode 28 is formed using a metal material. Specifically, n-side electrode 28 includes at least one type of metal selected from a group including Ti, Al, Pt, Au, Mo, Sn, In, Ni, Cr, Nb, Ba, Ag, Rh, Ir, Ru, and Hf, or an alloy of at least two types of metal selected from this group. N-side electrode 28 has, for example, a laminate structure including an Au film having a thickness of 300 nm, a Pt film having a thickness of 35 nm, and a Ti film having a thickness of 10 nm. Among the films forming the laminate structure, the Ti film is located on the substrate 31 side.

Semiconductor laser device 10 configured as above emits laser light having an oscillation wavelength of 405 nm (blue-violet light), for example. Semiconductor laser device 10 has a chip width of 150 μm, a resonator length of 800 μm, and a ridge width (stripe width) of 7 μm on the front end surface 36 side and 6 μm on the rear end surface 37 side. Semiconductor laser device 10 has light output of 0.7 W in continuous oscillation. Semiconductor laser device 10 has a maximum operating current of 0.47 A. At this time, the current density of first electrode 25 is 1.1 $kAcm^{-2}$, and the current density of n-side electrode 28 is 0.47 $kAcm^{-2}$. The electrode area size of n-side electrode 28 is $1.0 \times 10^{-3}$ $cm^2$. The operating voltage of semiconductor laser device 10 is 4.7 V, and the maximum junction temperature during operation is 91 degrees Celsius. Note that these numerical values are mere examples, and may be altered as appropriate.

Although Table 1 illustrates the case where active layer 33 has a multi quantum well structure, active layer 33 may have a single quantum well structure as shown in Table 2.

TABLE 2

| | | Material | Thickness [nm] | Impurity concentration [$cm^{-3}$] |
|---|---|---|---|---|
| Second electrode 23 | | Au | 2000 | |
| First electrode 25 | | Pt | 100 | |
| | | Pd | 40 | |
| P-type semiconductor layer 34 | P-type contact layer | $p^+$-GaN | 10 | $2.00 \times 10^{20}$ |
| | | p-GaN | 50 | $2.00 \times 10^{19}$ |
| | P-type clad layer | p-AlGaN | 409 | $1.00 \times 10^{19}$ |
| | | p-AlGaN | 250 | $2.00 \times 10^{18}$ |
| | Electron block layer | p-AlGaN | 1 | $1.50 \times 10^{19}$ |
| | | p-AlGaN | 5 | $1.50 \times 10^{19}$ |
| | P-side guide layer | GaN | 3 | $1.50 \times 10^{19}$ |
| | | GaN | 6 | Undoped |
| | | InGaN | 60 | Undoped |
| Active layer 33 | Barrier layer | InGaN | 18 | Undoped |
| | Well layer | InGaN | 7.5 | Undoped |
| | Barrier layer | InGaN | 190 | Undoped |
| N-type semiconductor layer 32 | N-side guide layer | GaN | 127 | $5.00 \times 10^{17}$ |
| | N-type clad layer | AlGaN | 3000 | $5.00 \times 10^{17}$ |
| Substrate 31 | | GaN | 85000 | $1.40 \times 10^{18}$ |
| N-side electrode 28 | | Ti | 10 | |
| | | Pt | 35 | |
| | | Au | 300 | |

Semiconductor laser device 10 according to a variation shown in Table 2 has a structure different from the structure shown in Table 1 in terms of the layer configuration of active layer 33 and the thicknesses of (i) the InGaN layer of the p-side guide layer located on the lower layer side, (ii) the Pt film of first electrode 25, and (iii) second electrode 23. Although not shown in Table 1 or Table 2, the thickness of the Pt film of adhesion layer 22 is also different. Specifically, the thickness of the Pt film of adhesion layer 22 is greater than that in the case of Table 1, and is 100 nm, for example.

Active layer 33 according to the present variation has one well layer and two barrier layers. The well layer is an undoped InGaN layer having a thickness of 7.5 nm. The composition ratio of In in the well layer is adjusted to make the oscillation wavelength 405 nm, for example. Each of the two barrier layers is an undoped $In_{0.08}Ga_{0.92}N$ layer, and the thicknesses thereof are different from one another as shown in Table 2.

The InGaN layer in contact with the n-side guide layer (that is, the InGaN layer located on the lower layer side) has a thickness of 190 nm. The InGaN layer of the p-side guide layer is 60 nm in thickness, which is greater than the thickness thereof in the case of Table 1. With this, the effect of light confinement to the well layers in the laminating direction can be enhanced, and light loss in the waveguide can be as low as 2.9 $cm^{-1}$.

Semiconductor laser device 10 according to the present variation emits laser light having an oscillation wavelength of 405 nm, for example. Semiconductor laser device 10 according to the present variation has a chip width of 150 µm, a resonator length of 1200 µm, and a ridge width (stripe width) of 30 µm on the front end surface 36 side and 28 µm on the rear end surface 37 side. Semiconductor laser device 10 according to the present variation has light output of 3.5 W in continuous oscillation. Semiconductor laser device 10 according to the present variation has a maximum operating current of 2.4 A. At this time, the current density of first electrode 25 is 6.2 $kAcm^{-2}$, and the current density of n-side electrode 28 is 1.8 $kAcm^{-2}$. The electrode area size of n-side electrode 28 is $1.3 \times 10^{-3}$ $cm^2$. The operating voltage of semiconductor laser device 10 according to the present variation is 4.9 V, and the maximum junction temperature during operation is at least 140 degrees Celsius and at most 150 degrees Celsius. Note that these numerical values are mere examples, and may be altered as appropriate.

In the present variation, the ridge width is at least 28 µm, thereby enabling reduction in the laser light density and inhibition of end surface breakdown caused by the end surfaces of semiconductor laser device 10 absorbing light emitted by the laser device itself. Having a resonator length of at least 1200 µm makes it possible to enhance the heat dissipation of semiconductor laser device 10. Note that, since active layer 33 has a single quantum well structure, it is possible to inhibit an increase in a threshold current (an oscillation current threshold) and a decrease in the slope efficiency in the current-light output characteristics that are caused by an increase in the resonator length. As can be understood from above, semiconductor laser device 10 according to the present variation is capable of achieving reduction in the threshold current and reduction in the operating current.

Note that the oscillation wavelength of semiconductor laser device 10 is not limited to 405 nm. For example, semiconductor laser device 10 may emit laser light having an oscillation wavelength of 445 nm (blue light). Semiconductor laser device 10 that emits blue light can be implemented with the same configuration as that of semiconductor laser device 10 according to the variation shown in Table 2. Specifically, a laser element that outputs blue laser is implemented by adjusting the composition ratio of In in the well layer of active layer 33.

[1-2. Functions and Advantageous Effects]

Next, main functions and advantageous effects of semiconductor laser device 10 according to the present embodiment will be described with reference to FIG. 1A to FIG. 3B while comparing with a comparative example.

Figure 2A:
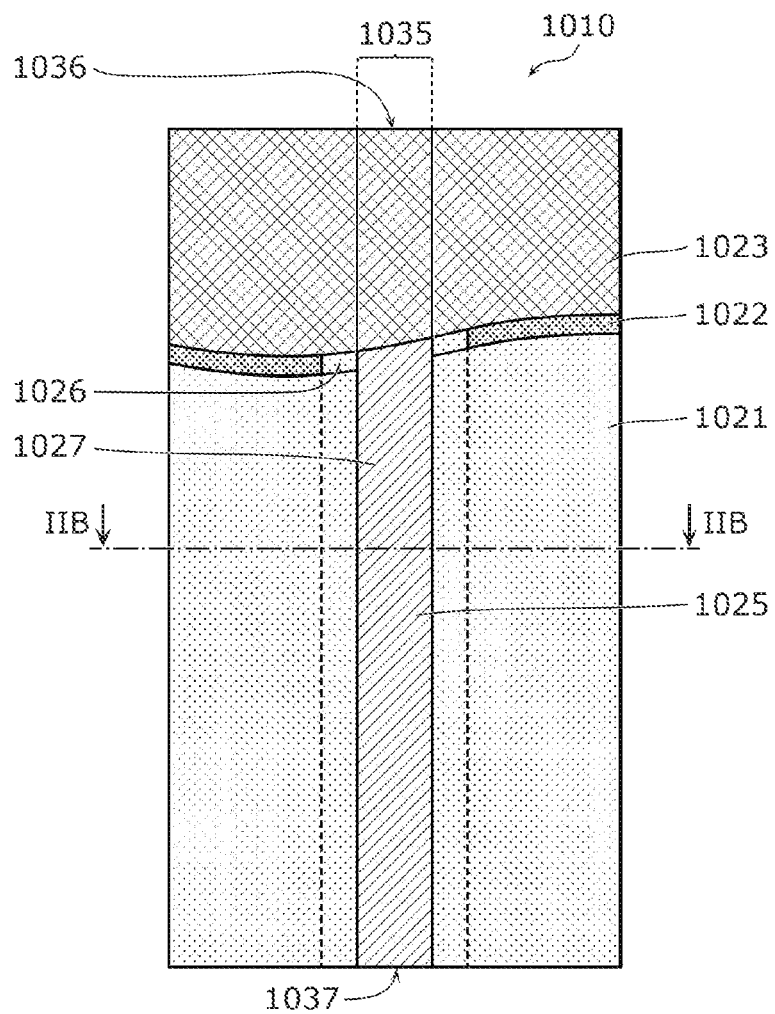
FIG. 2A is a plan view schematically illustrating an overall configuration of a semiconductor laser device according to Comparative Example 1.
Figure 2B:
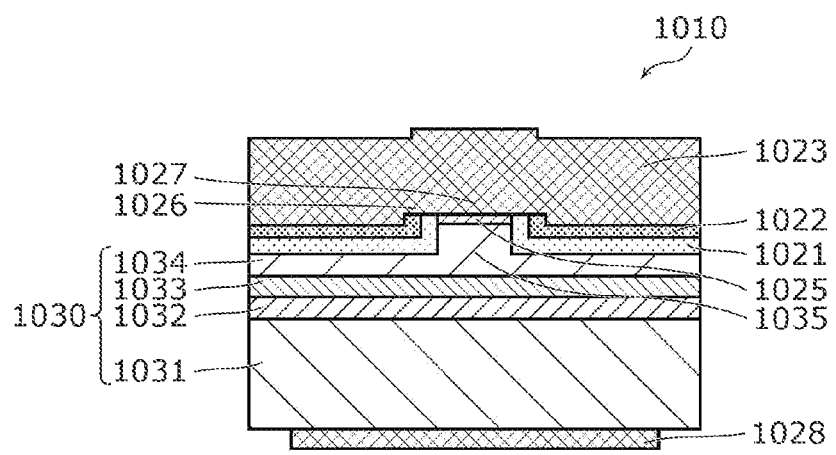
FIG. 2B is a cross-sectional view schematically illustrating the overall configuration of the semiconductor laser device according to Comparative Example 1.

FIG. 2A and FIG. 2B are a plan view and a cross-sectional view, respectively, each schematically illustrating the overall configuration of semiconductor laser device 1010 according to Comparative Example 1. In FIG. 2A, second electrode 1023 and adhesion layer 1022 are partially cut out to show the configuration of semiconductor laser device 1010.

Semiconductor laser device 1010 of Comparative Example 1 illustrated in FIG. 2A and FIG. 2B is a device that emits laser light, and includes front end surface 1036 and rear end surface 1037. As with semiconductor laser device 10 according to the present embodiment, semiconductor laser device 1010 includes semiconductor laminate body 1030, insulating layer 1021, first electrode 1025, second electrode 1023, adhesion layer 1022, and n-side electrode 1028. Semiconductor laminate body 1030 includes substrate 1031, n-type semiconductor layer 1032, active layer 1033, and p-type semiconductor layer 1034. Ridge portion 1035 is formed in p-type semiconductor layer 1034.

Semiconductor laser device 1010 of Comparative Example 1 is different from semiconductor laser device 10 according to the present embodiment in mainly the configurations of insulating layer 1021, first electrode 1025, second electrode 1023, and adhesion layer 1022.

As illustrated in FIG. 2A, although insulating layer 1021 has first opening 1027 similar to first opening 27 according to Embodiment 1, first opening 1027 is different from first opening 27 according to Embodiment 1 in that it extends from front end surface 1036 to rear end surface 1037. As such, first electrode 1025 also extends from front end surface 1036 to rear end surface 1037. Although adhesion layer 1022 has second opening 1026 similar to second opening 26 according to Embodiment 1, second opening 1026 is different from second opening 26 according to Embodiment 1 in that it also extends from front end surface 1036 to rear end surface 1037.

Second electrode 1023 is disposed in the entirety of the upper surface of semiconductor laser device 1010 including the vicinity of front end surface 1036 and the vicinity of rear end surface 1037.

Since semiconductor laser device 1010 of Comparative Example 1 has the above-described configuration, the cross section perpendicular to the first direction extending from front end surface 1036 toward rear end surface 1037 at any position between front end surface 1036 and rear end surface 1037 is the same as the cross section illustrated in FIG. 2B.

As illustrated in FIG. 2A, in semiconductor laser device 1010 of Comparative Example 1, second electrode 1023 is disposed but adhesion layer 1022 is not disposed in regions of front end surface 1036 and rear end surface 1037 in the vicinity of ridge portion 1035. Consequently, with semiconductor laser device 1010 of Comparative Example 1, the adhesion of second electrode 1023 in the vicinity of ridge portion 1035 is lower than the adhesion thereof in the other regions, and thus second electrode 1023 is likely to peel.

Figure 1C:
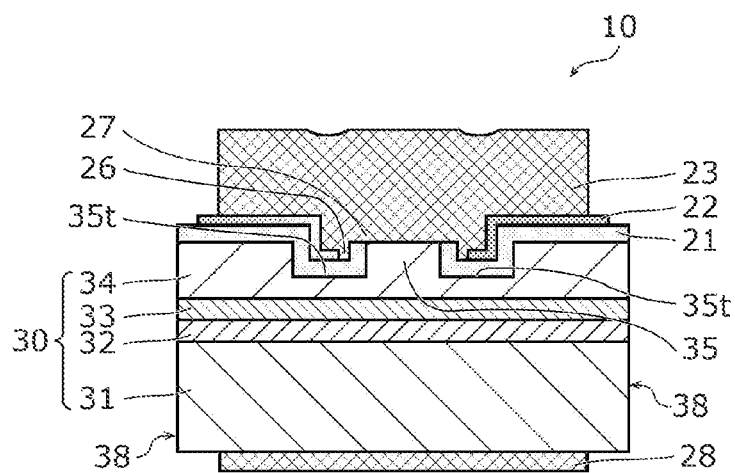
FIG. 1C is a second cross-sectional view schematically illustrating the overall configuration of the semiconductor laser device according to Embodiment 1.
Figure 1D:
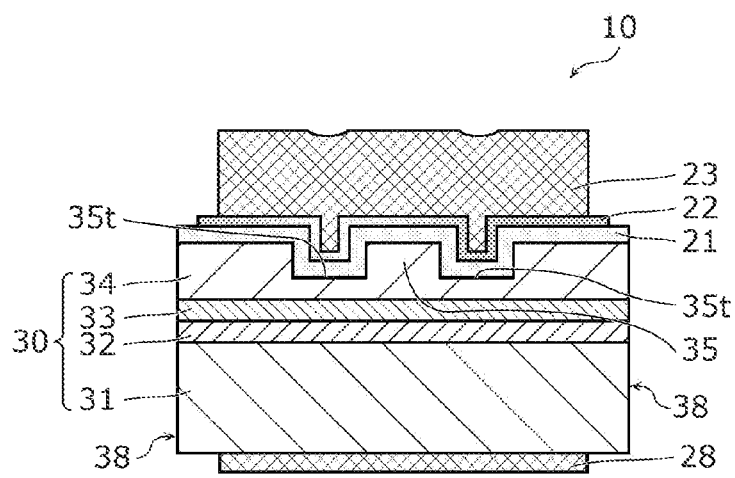
FIG. 1D is a third cross-sectional view schematically illustrating the overall configuration of the semiconductor laser device according to Embodiment 1.
Figure 1E:
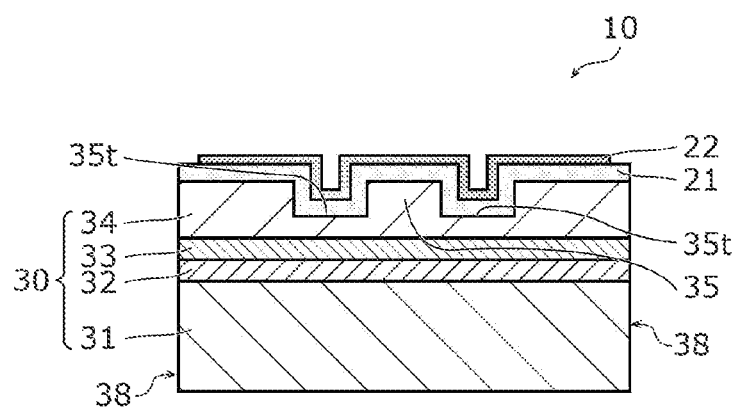
FIG. 1E is a fourth cross-sectional view schematically illustrating the overall configuration of the semiconductor laser device according to Embodiment 1.
Figure 1F:
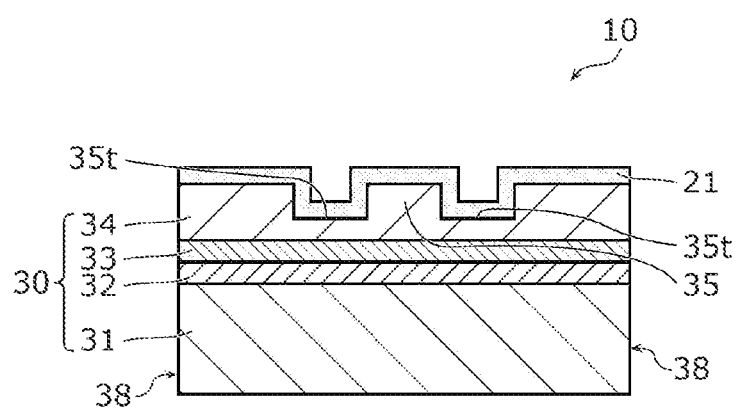
FIG. 1F is a fifth cross-sectional view schematically illustrating the overall configuration of the semiconductor laser device according to Embodiment 1.

In contrast, in semiconductor laser device 10 according to the present embodiment, second electrode 23 and adhesion layer 22 are disposed above insulating layer 21 between first opening 27 and front end surface 36 and between first opening 27 and rear end surface 37 as illustrated in FIG. 1A, FIG. 1C, and FIG. 1D. Also, as illustrated in FIG. 1C, in part of first opening 27 where first electrode 25 is not formed, second electrode 23 is disposed in contact with the upper surface of ridge portion 35 of p-type semiconductor layer 34.

As described above, since second electrode 23 and adhesion layer 22 are disposed above insulating layer 21 between first opening 27 and front end surface 36 and between first opening 27 and rear end surface 37, it is possible to enhance the adhesion (that is, the bonding strength) between second electrode 23 and insulating layer 21 at front end surface 36 and rear end surface 37. Therefore, it is possible to inhibit second electrode 23 from peeling at front end surface 36 and rear end surface 37. Note that although second electrode 23 and adhesion layer 22 in the present embodiment are disposed above insulating layer 21 between first opening 27 and front end surface 36 and between first opening 27 and rear end surface 37, the configurations of second electrode 23 and adhesion layer 22 are not limited to this example. It is sufficient so long as second electrode 23 and adhesion layer 22 are disposed above insulating layer 21 between first opening 27 and at least one of front end surface 36 or rear end surface 37.

Second electrode 1023 of Comparative Example 1 is disposed also in the vicinity of front end surface 1036 and in the vicinity of rear end surface 1037. In a top view, end portions of second electrode 1023 are in agreement with front end surface 1036 and rear end surface 1037. Here, in such a device as semiconductor laser device 1010, front end surface 1036 and rear end surface 1037 are formed generally by cleavage. Thus, in the case where second electrode 1023 is disposed in the vicinity of front end surface 1036 and in the vicinity of rear end surface 1037, second electrode 1023 is likely to peel at the time of cleavage.

In contrast, second electrode 23 according to the present embodiment is disposed not to be in contact with at least one of front end surface 36 or rear end surface 37. This way, it is possible to inhibit second electrode 23 from peeling at at least one end surface.

Also, in the present embodiment, in a plan view of adhesion layer 22, the perimeter of second electrode 23 is at least partially located inside the perimeter of adhesion layer 22 and outside the perimeter of first opening 27 and the perimeter of second opening 26 as illustrated in FIG. 1A. This way, adhesion layer 22 is disposed between insulating layer 21 and the perimeter of second electrode 23, and it is thus possible to inhibit second electrode 23 from peeling at its perimeter.

In semiconductor laser device 10 according to the present embodiment, adhesion layer 22 is not in contact with first electrode 25. Advantageous effects yielded by this configuration will now be described with reference to FIG. 3A and FIG. 3B.

Figure 3A:
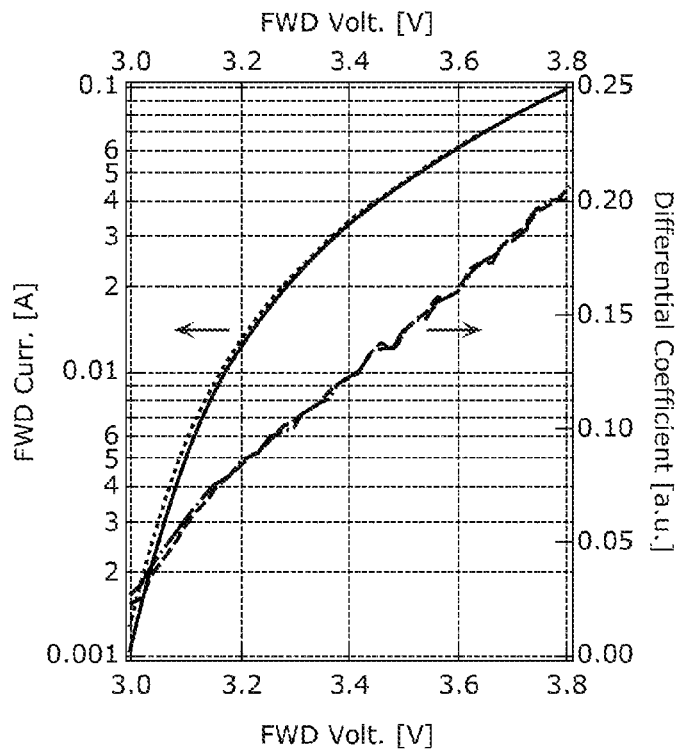
FIG. 3A is a graph illustrating the I-V characteristic of the semiconductor laser device according to Embodiment 1 before and after a reliability test.
Figure 3B:
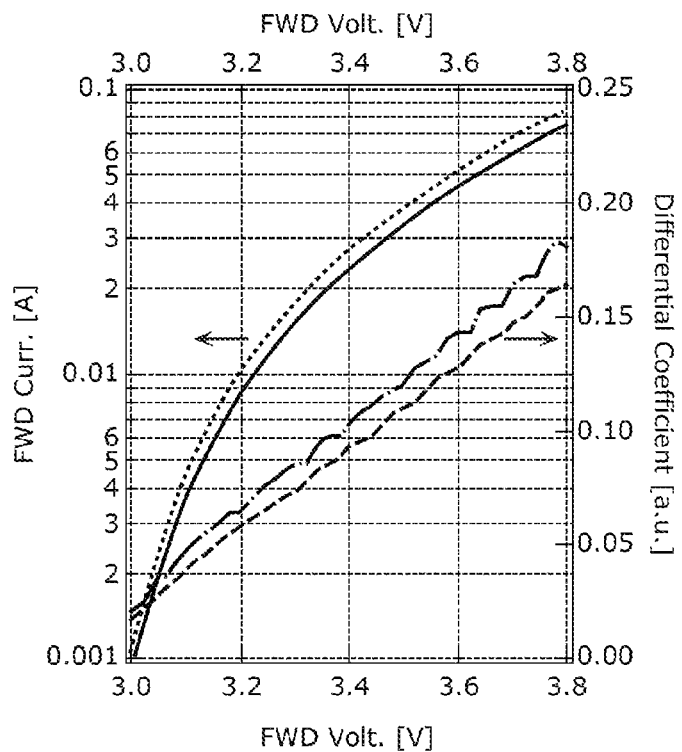
FIG. 3B is a graph illustrating the I-V characteristic of a semiconductor laser device according to Comparative Example 2 before and after a reliability test.

FIG. 3A and FIG. 3B are graphs respectively illustrating the I-V characteristic of semiconductor laser device 10 according to the present embodiment and a semiconductor laser device according to Comparative Example 2 before and after a reliability test. FIG. 3A and FIG. 3B also illustrate a graph showing a differential coefficient of a curve indicating the I-V characteristic. In FIG. 3A and FIG. 3B, the horizontal axis represents forward voltage (FWD Volt.), the vertical axis on the left side represents forward current (FWD Curr.), and the vertical axis on the right side represents a differential coefficient obtained by differentiating forward current with respect to voltage. Also, in FIG. 3A and FIG. 3B, the dotted line and the solid line show the I-V characteristic before a reliability test and after the reliability test, respectively, and a dash-dot-dash line and a broken line show a differential coefficient obtained by differentiating forward current with respect to voltage before the reliability test and after the reliability test, respectively.

The semiconductor laser device of Comparative Example 2 is different from semiconductor laser device 10 according to the present embodiment in that the adhesion layer does not have a second opening. The other aspects are the same as semiconductor laser device 10 according to the present embodiment. As can be understood from above, in the semiconductor laser device of Comparative Example 2, the adhesion layer is disposed on the first electrode as well, and thus, the entire upper surface of the first electrode is in contact with the adhesion layer.

In the reliability test, a process of increasing the forward voltage applied to each semiconductor laser device from 0 V to 5 V in increments of 20 mV was repeated 3 times.

As illustrated in FIG. 3A, although semiconductor laser device 10 according to the present embodiment exhibits almost no change in the I-V characteristic before and after the reliability test, the semiconductor laser device of Comparative Example 2 exhibits, after the reliability test, a rise in the forward voltage required for applying a predetermined forward current. Here, the differential coefficient of the I-V characteristic is equivalent to the electrical conductivity (a reciprocal of the resistance value) of the semiconductor laser device. As illustrated in FIG. 3B, the differential coefficient after the reliability test is lower than that before the reliability test. In other words, the resistance value of the semiconductor laser device after the reliability test is higher than that before the reliability test. This is presumed to have been caused by the following function of the adhesion layer. The adhesion layer is in contact with the insulating layer. The insulating layer including $SiO_2$ etc. contains a lot of H atoms, and the adhesion layer including Ti etc. has the function of absorbing the H atoms of the insulating layer. Thus, the H atoms are supplied to the first electrode via the adhesion layer. The H atoms that reach the first electrode by being driven by the potential difference and/or heat generated during operation of the semiconductor laser device bond with Mg with which the p-type nitride-based semiconductor layer has been doped, and inactivate the carriers in the p-type nitride-based semiconductor layer. This is presumed to be the cause of the rise in the resistance value of the semiconductor laser device of Comparative Example 2 after the reliability test. In view of the above, it is considered that the rise in the operating voltage during laser operation can be inhibited by disposing adhesion layer 22 not to be in contact with first electrode 25 as in semiconductor laser device 10 according to the present embodiment.

In the present embodiment, in a plan view of adhesion layer 22, an edge of second opening 26 adjacent to side end surface 38 of semiconductor laminate body 30 is located between this side end surface 38 of semiconductor laminate body 30 and an edge of first opening 27 adjacent to this side end surface 38 of semiconductor laminate body 30 in the second direction perpendicular to the first direction. This way, it is possible to dispose first electrode 25 up to the edge of first opening 27 closest to side end surface 38, without adhesion layer 22 and first electrode 25 coming into contact with one another. Accordingly, it is possible to inhibit an increase in the resistance value of semiconductor laser device 10, and maximize the area size of first electrode 25 in the vicinity of side end surface 38.

In a plan view of adhesion layer 22, at least a part of the edges of second opening 26 is located on an edge of first opening 27. In the present embodiment, in a plan view of adhesion layer 22, an edge of second opening 26 closest to one end surface among front end surface 36 and rear end surface 37 is located on an edge of first opening 27 closest to the one end surface as illustrated in FIG. 1A and FIG. 1D. Such a configuration can increase the area of contact between adhesion layer 22 and second electrode 23, thus making it possible to further inhibit second electrode 23 from peeling.

[1-3. Manufacturing Method]

Figure 4A:
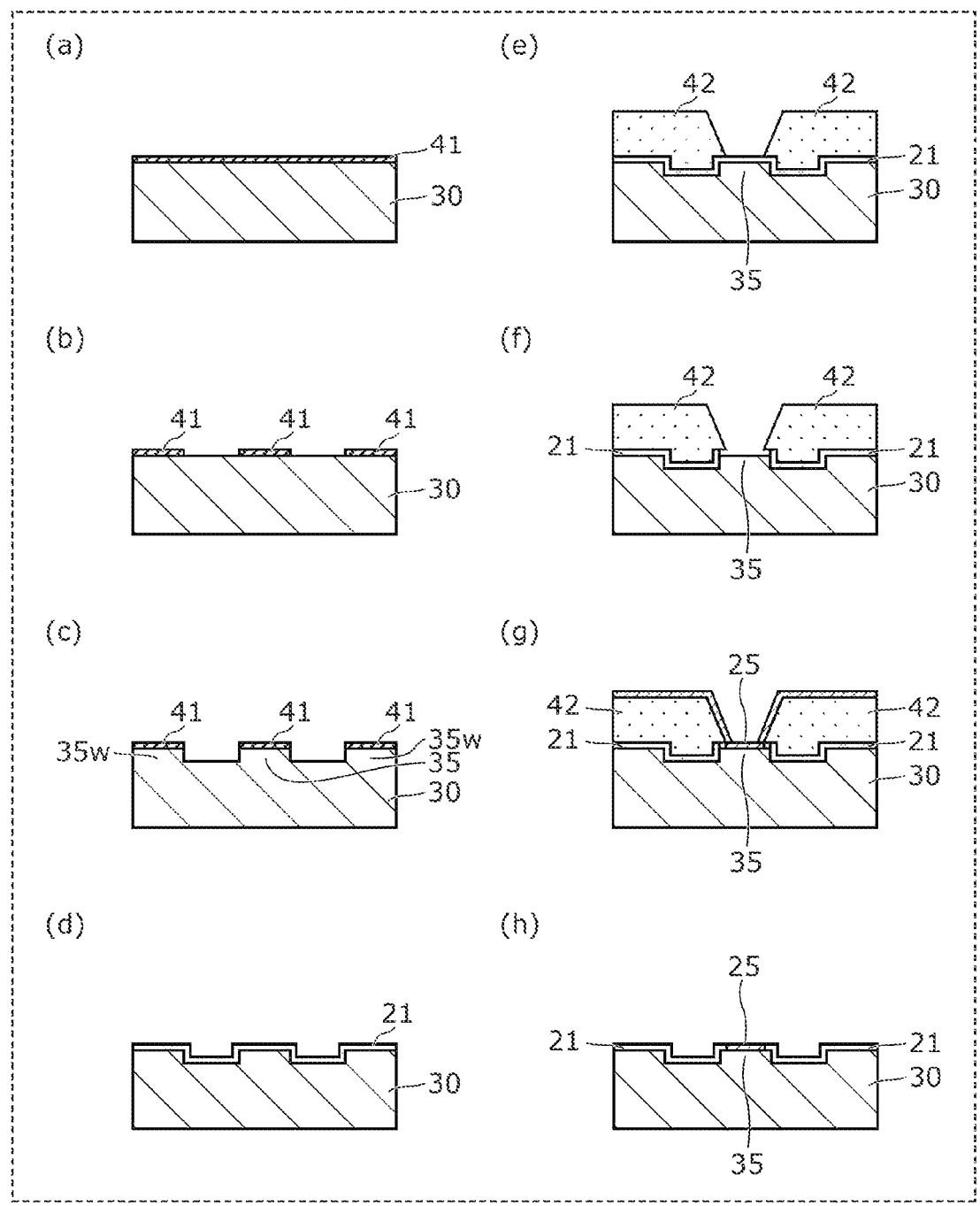
FIG. 4A shows cross-sectional views schematically illustrating, among processes included in a manufacturing method of the semiconductor laser device according to Embodiment 1, processes up to a process of forming a first electrode.
Figure 4B:
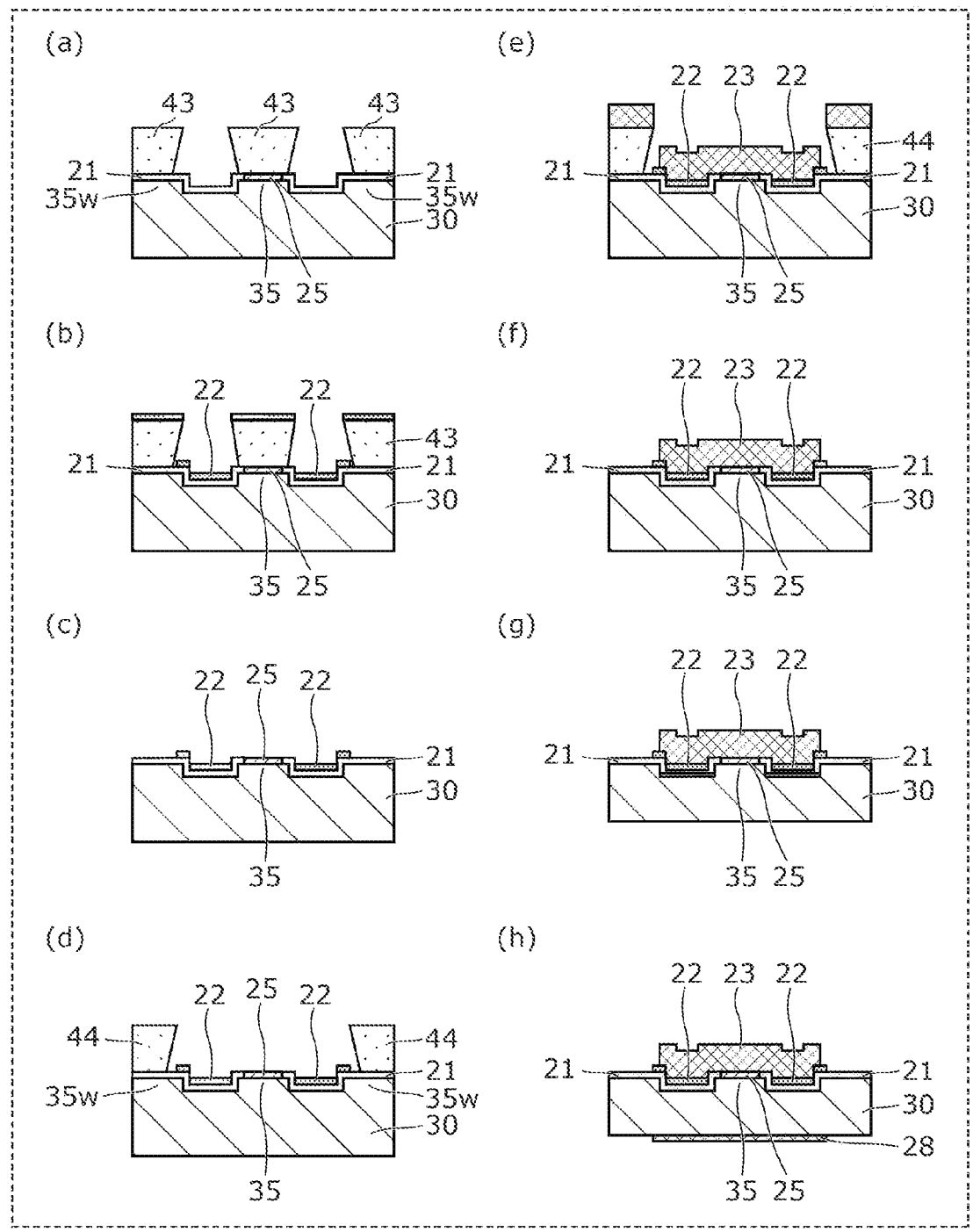
FIG. 4B shows cross-sectional views schematically illustrating, among the processes included in the manufacturing method of the semiconductor laser device according to Embodiment 1, a process of forming an adhesion layer and processes thereafter.

Next, a manufacturing method of semiconductor laser device 10 according to the present embodiment will be described with reference to FIG. 4A and FIG. 4B. FIG. 4A shows cross-sectional views schematically illustrating, among processes included in the manufacturing method of semiconductor laser device 10 according to the present embodiment, processes up to a process of forming first electrode 25. FIG. 4B shows cross-sectional views schematically illustrating, among the processes included in the manufacturing method of semiconductor laser device 10 according to the present embodiment, a process of forming adhesion layer 22 and processes thereafter. The cross sections illustrated in FIG. 4A and FIG. 4B are taken at the same position as the cross section illustrated in FIG. 1B.

As illustrated in cross-sectional view (a) in FIG. 4A, first, semiconductor laminate body 30 is formed, and oxide film 41 that is to be used as a mask is disposed on semiconductor laminate body 30. Semiconductor layers included in semiconductor laminate body 30 are formed by, for example, metal organic chemical vapor deposition (MOCVD) or an epitaxial growth method such as molecular beam epitaxy (MBE). This way, n-type semiconductor layer 32, active layer 33, and p-type semiconductor layer 34 are formed in the stated order on substrate 31.

After forming semiconductor laminate body 30, oxide film 41 is formed on p-type semiconductor layer 34, which is the topmost layer of semiconductor laminate body 30. Oxide film 41 is, for example, an insulating film such as a silicon oxide film, and formed by atmospheric pressure chemical vapor deposition (AP-CVD), for instance. By providing oxide film 41, it is possible to protect the surface of p-type semiconductor layer 34 in the process of forming ridge portion 35 that is described later. After forming oxide film 41, annealing is performed for approximately 60 minutes at approximately 800 degrees Celsius.

Next, as illustrated in cross-sectional view (b) in FIG. 4A, oxide film 41 is patterned. Specifically, a photosensitive resist is applied to oxide film 41, and part that is targeted for removal is removed by photolithography and etching. After oxide film 41 is patterned in such a manner, the photosensitive resist is removed.

Next, as illustrated in cross-sectional view (c) in FIG. 4A, ridge portion 35 and protruding portions 35w are formed. Specifically, by using patterned oxide film 41 as a mask, etching is performed in, of the region of p-type semiconductor layer 34, areas between an area which is to be ridge portion 35 and areas which are to be protruding portions 35w. The etching performed on p-type semiconductor layer 34 is dry etching, but may be wet etching. Gas introduced to the chamber during dry etching is a chlorine-based gas including $BCl_3$ and $Cl_2$, for example.

Next, as illustrated in cross-sectional view (d) in FIG. 4A, insulating layer 21 is formed. Specifically, after oxide film 41 is removed by etching, insulating layer 21 including $SiO_2$ is formed on p-type semiconductor layer 34 by plasma CVD.

Next, as illustrated in cross-sectional view (e) in FIG. 4A, photosensitive resist 42 is applied on insulating layer 21 and photolithography is performed so as to carry out patterning. Here, photosensitive resist 42 disposed above ridge portion 35 is removed.

Next, as illustrated in cross-sectional view (f) in FIG. 4A, a part of insulating layer 21 located on ridge portion 35 and not covered by photosensitive resist 42 is removed by etching. The etching performed on insulating layer 21 is dry etching, but may be wet etching. Dry etching and wet etching may be both performed in combination. When dry etching is performed on insulating layer 21 including $SiO_2$ as in the present embodiment, a gas including $CF_4$ is used as the introduced gas, for example.

Next, as illustrated in cross-sectional view (g) in FIG. 4A, first electrode 25 is formed on the entire upper surface of semiconductor laminate body 30. That is to say, first electrode 25 is formed on the upper surface of ridge portion 35 of semiconductor laminate body 30 and the upper surface of photosensitive resist 42.

Next, as illustrated in cross-sectional view (h) in FIG. 4A, photosensitive resist 42 and first electrode 25 that is formed on the upper surface of photosensitive resist 42 are removed by lift-off. Subsequently, a heat treatment may be performed on first electrode 25, for example. Specifically, a laminate body including semiconductor laminate body 30, insulating layer 21, and first electrode 25 that are formed through the above processes is heated by being disposed on, for example, a hot plate that is pre-heated to a predetermined processing temperature. For example, the atmosphere during the heat treatment is the air, the temperature is approximately 200 degrees Celsius, and the treatment period is approximately 40 minutes. By performing such a heat treatment, the contact resistivity of first electrode 25 according to the present embodiment can be reduced to less than $2.5 \times 10^{-4}$ $\Omega cm^2$. Note that the process of the heat treatment is not limited to this example. For example, a laminate body including semiconductor laminate body 30, insulating layer 21, and first electrode 25 may be heated in a rapid thermal annealing (RTA) furnace. Specifically, after being brought into the RTA furnace, the laminate body is heated to approximately 350 degrees Celsius at a predetermined temperature gradient in an oxygen atmosphere, and is maintained for approximately 10 minutes. Thereafter, the laminate body is taken out after being cooled down in the furnace. By performing such a heat treatment, the contact resistivity of first electrode 25 according to the present embodiment can be reduced to less than $2.2 \times 10^{-4}$ $\Omega cm^2$.

Next, as illustrated in cross-sectional view (a) in FIG. 4B, photosensitive resist 43 is applied in the entire region above semiconductor laminate body 30, and photolithography is performed to carry out patterning. Here, part of photosensitive resist 43 which is in regions other than the regions above ridge portion 35, protruding portions 35w, front end surface 36, and rear end surface 37 is removed.

Next, as illustrated in cross-sectional view (b) in FIG. 4B, adhesion layer 22 is formed in the entire region above semiconductor laminate body 30. That is to say, adhesion layer 22 is formed on photosensitive resist 43 and insulating layer 21. In the present embodiment, adhesion layer 22 is formed by forming a Ti layer as the lower layer and then a Pt layer as the upper layer.

Next, as illustrated in cross-sectional view (c) in FIG. 4B, photosensitive resist 43 and adhesion layer 22 which is formed on the upper surface of photosensitive resist 43 are removed by lift-off.

Next, as illustrated in cross-sectional view (d) in FIG. 4B, photosensitive resist 44 is applied in the entire region above semiconductor laminate body 30, and photolithography is performed to carry out patterning. Here, part of photosensitive resist 44 which is in a region other than the regions above protruding portions 35w, front end surface 36, and rear end surface 37 is removed.

Next, as illustrated in cross-sectional view (e) in FIG. 4B, second electrode 23 is formed in the entire region above semiconductor laminate body 30. That is to say, second electrode 23 is formed on photosensitive resist 44, insulating layer 21, adhesion layer 22, and first electrode 25. In the present embodiment, an Au layer is formed as second electrode 23. Second electrode 23 may be formed in a manner that the length of a gap between second electrodes 23 that are adjacent in the resonator direction corresponding to the longitudinal direction of ridge portion 35 formed by photolithography becomes at least 0.2 μm and less than 40 μm. Cleavage may be performed at the center of the gap, and the cleavage surface may serve as front end surface 36 or rear end surface 37. This way, second electrode 23 is disposed at a distance of at least 0.1 μm and less than 20 μm from front end surface 36 or rear end surface 37. On the other hand, when the resonator direction and the crystal plane are not in agreement, the distance from second electrode 23 to front end surface 36 or rear end surface 37 is shortened in one of the chips at the two ends of a bar-shaped element formed by the cleavage, and thus, a margin may be given to the length of the gap between second electrodes 23 adjacent in the resonator direction. In consideration of this, the length of the gap may be at least 20 μm and less than 40 μm; that is, second electrode 23 may be disposed at a distance of at least 10 μm and less than 20 μm from front end surface 36 or rear end surface 37.

Next, as illustrated in cross-sectional view (f) in FIG. 4B, photosensitive resist 44 and second electrode 23 which is formed on the upper surface of photosensitive resist 44 are removed by lift-off. Here, the same heat treatment as the one performed after forming first electrode 25 may be performed. This way, the contact resistivity of first electrode 25 can be reduced.

Next, as illustrated in cross-sectional view (g) in FIG. 4B, the back surface of substrate 31 included in semiconductor laminate body 30 (that is, a surface opposite the surface on which first electrode 25 etc. is formed) is polished. For example, substrate 31 having a thickness of approximately 400 μm is polished until the thickness decreases to approximately 85 μm. Polishing is performed by chemical mechanical polishing (CMP), for example. This way, the resistance by substrate 31 can be reduced, and semiconductor laser device 10 can be downsized.

Next, as illustrated in cross-sectional view (h) in FIG. 4B, n-side electrode 28 is formed on the back surface of substrate 31 included in semiconductor laminate body 30. N-side electrode 28 is formed by, for example, forming a Ti film, a Pt film, and an Au film in the stated order by a vapor deposition method or a sputtering method, and then patterning these films. The patterning is performed by, for example, photolithography and/or etching.

With the above-described processes, semiconductor laser device illustrated in FIG. 1A to FIG. 1F is manufactured.

Embodiment 2

The following describes a semiconductor laser device according to Embodiment 2. The semiconductor laser device according to the present embodiment is different from semiconductor laser device 10 according to Embodiment 1 in mainly the configuration adopted for current constriction. Hereinafter, the semiconductor laser device according to the present embodiment will be described with reference to FIG. 5A and FIG. 5B, focusing on the difference from semiconductor laser device 10 according to Embodiment 1.

Figure 5A:
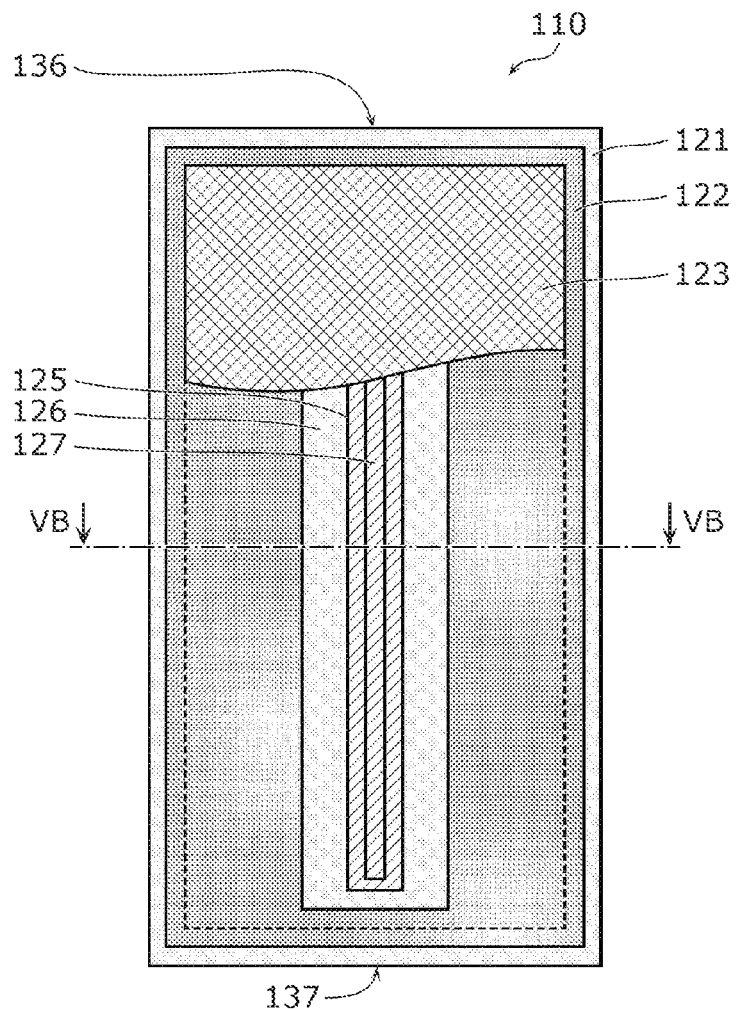
FIG. 5A is a plan view schematically illustrating an overall configuration of a semiconductor laser device according to Embodiment 2.
Figure 5B:
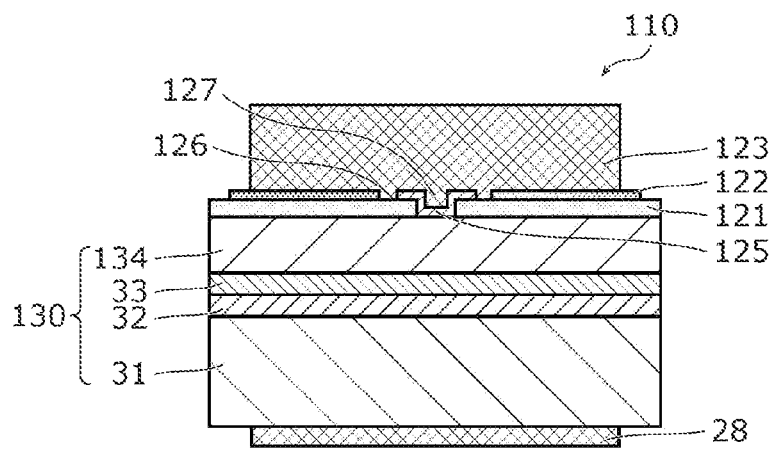
FIG. 5B is a cross-sectional view schematically illustrating the overall configuration of the semiconductor laser device according to Embodiment 2.

FIG. 5A is a plan view schematically illustrating an overall configuration of semiconductor laser device 110 according to the present embodiment. In FIG. 5A, second electrode 123 is partially cut out to show the configuration of, for example, adhesion layer 122. The cut-out part of second electrode 123 is illustrated with a dashed line to show the outline only. FIG. 5B is a cross-sectional view schematically illustrating the overall configuration of semiconductor laser device 110 according to the present embodiment. FIG. 5B illustrates a cross section taken at the VB-VB line shown in FIG. 5A.

As illustrated in FIG. 5B, semiconductor laser device 110 according to the present embodiment includes semiconductor laminate body 130, insulating layer 121, first electrode 125, second electrode 123, adhesion layer 122, and n-side electrode 28.

As illustrated in FIG. 5A, semiconductor laminate body 130 includes front end surface 136 through which laser light is emitted and rear end surface 137 that is opposite front end surface 136. Also, as illustrated in FIG. 5B, semiconductor laminate body 130 includes active layer 33 that generates laser light. Semiconductor laminate body 130 further includes substrate 31, n-type semiconductor layer 32, and p-type semiconductor layer 134. Note that one or more other layers may be interposed between the above-mentioned layers of semiconductor laminate body 130.

P-type semiconductor layer 134 is the same as p-type semiconductor layer 34 according to Embodiment 1, except that p-type semiconductor layer 134 does not have a ridge portion nor protruding portions of the same height as the ridge portion.

Insulating layer 121 is a dielectric layer that: is formed in the entire region of the upper surface of semiconductor laminate body 130; has first opening 127 extending in a first direction which is a direction from front end surface 136 toward rear end surface 137; and is disposed above semiconductor laminate body 130.

First electrode 125 is an electrode disposed above semiconductor laminate body 130. In the present embodiment, as illustrated in FIG. 5A and FIG. 5B, first electrode 125 is disposed inside first opening 127 of insulating layer 121 and on part of insulating layer 121 that is 2 μm from the four sides of the perimeter of first opening 127. As illustrated in FIG. 5A, first electrode 125 is not disposed in the vicinities of front end surface 136 and rear end surface 137. The perimeter of first opening 127 of insulating layer 121 is located inside the perimeter of first electrode 125 at a distance of at least 0.1 μm and less than the width of the first electrode from the perimeter of first electrode 125. Furthermore, the perimeter of first opening 127 is located inside the perimeter of second opening 126 at a distance of at least 0.1 μm and less than 5 μm from the perimeter of second opening 126.

Second electrode 123 is an electrode disposed above first electrode 125 and insulating layer 121. Second electrode 123 is disposed above insulating layer 121 between first opening 127 and at least one of front end surface 136 or rear end surface 137. As illustrated in FIG. 5A, second electrode 123 is disposed not to be in contact with front end surface 136 nor rear end surface 137. Specifically, the perimeter of second electrode 123 is located at a distance of at least 0.1 μm and less than 20 μm from front end surface 136 and rear end surface 137.

Adhesion layer 122 is a layer disposed between second electrode 123 and insulating layer 121. Adhesion layer 122 has second opening 126 that at least partially overlaps with first opening 127 in a plan view of adhesion layer 122. As illustrated in FIG. 5A, first electrode 125 is at least partially disposed inside first opening 127 and second opening 126 in a plan view of adhesion layer 122. This allows second electrode 123 to be in contact with first electrode 125 disposed inside first opening 127 and second opening 126. Note that in the present embodiment, the entirety of first electrode 125 is disposed inside second opening 126 and part of first electrode 125 is disposed inside first opening 127 in a plan view of adhesion layer 122. Adhesion layer 122 is disposed above insulating layer 121 between first opening 127 and at least one of front end surface 136 or rear end surface 137. Specifically, the perimeter of adhesion layer 122 is located at a distance of at least 0.1 μm and less than 10 μm from at least one of front end surface 136 or rear end surface 137, and the perimeter of second opening 126 is located outside the perimeter of first opening 127 at a distance of at least 0.1 μm and less than 20 μm from the perimeter of first opening 127.

Semiconductor laser device 110 according to the present embodiment having the above-described configuration can produce an advantageous effect of inhibiting second electrode 123 from peeling as with semiconductor laser device 10 according to Embodiment 1.

Embodiment 3

The following describes a semiconductor laser device according to Embodiment 3. The semiconductor laser device according to the present embodiment is different from semiconductor laser device 10 according to Embodiment 1 in mainly the configurations of the insulating layer and the adhesion layer. Hereinafter, the semiconductor laser device according to the present embodiment will be described with reference to FIG. 6A to FIG. 6C, focusing on the differences from semiconductor laser device 10 according to Embodiment 1.

Figure 6A:
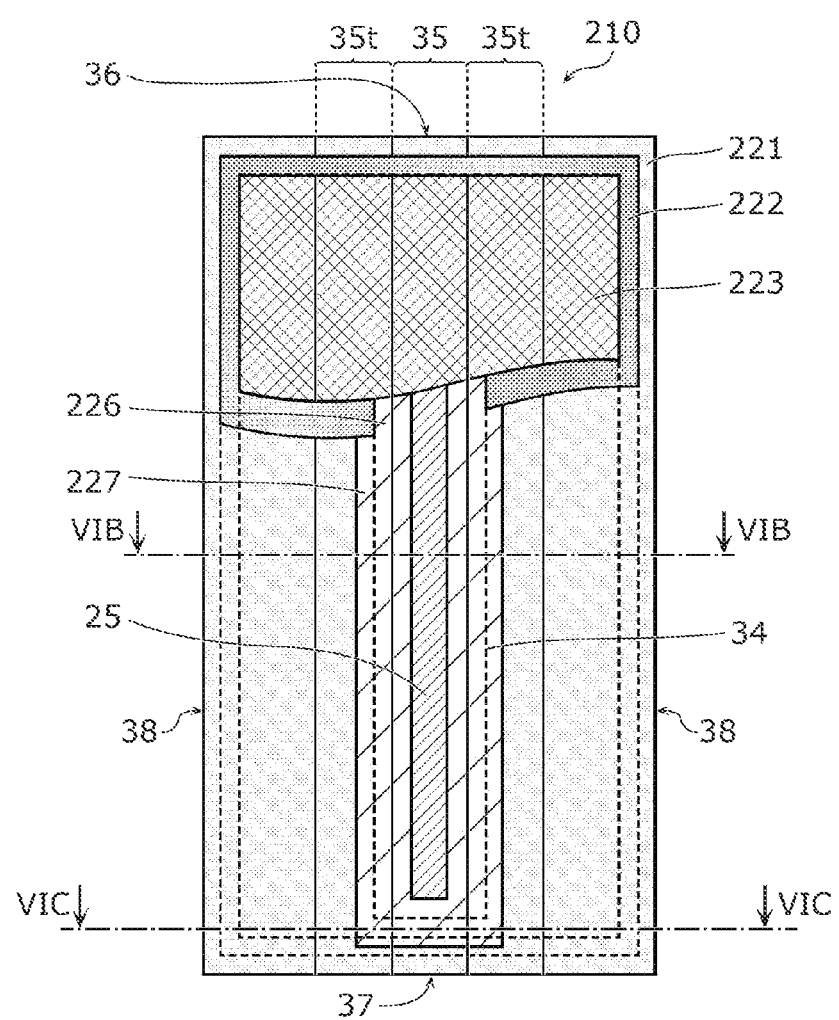
FIG. 6A is a plan view schematically illustrating an overall configuration of a semiconductor laser device according to Embodiment 3.
Figure 6B:
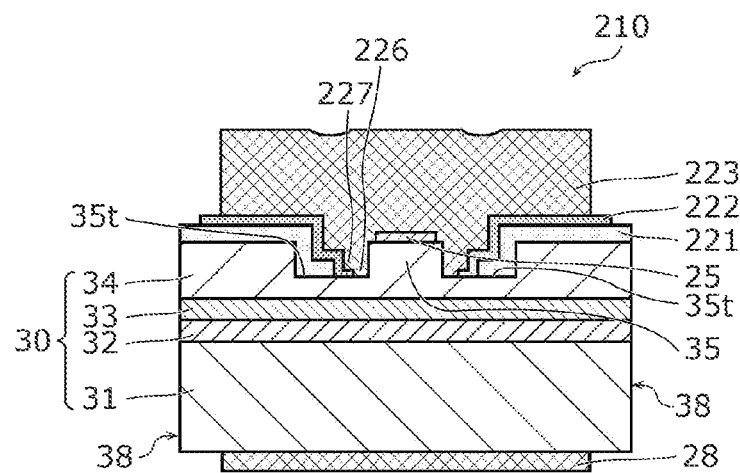
FIG. 6B is a first cross-sectional view schematically illustrating the overall configuration of the semiconductor laser device according to Embodiment 3.
Figure 6C:
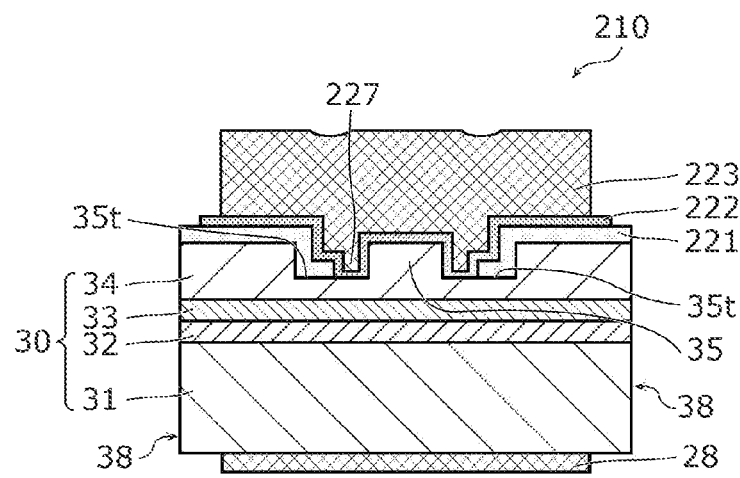
FIG. 6C is a second cross-sectional view schematically illustrating the overall configuration of the semiconductor laser device according to Embodiment 3.

FIG. 6A is a plan view schematically illustrating an overall configuration of semiconductor laser device 210 according to the present embodiment. In FIG. 6A, second electrode 223 is partially cut out to show the configuration of, for example, adhesion layer 222. The cut-out part of second electrode 223 is illustrated with a dashed line to show the outline only. Furthermore, in FIG. 6A, adhesion layer 222 is partially cut out to show the configuration of, for example, insulating layer 221. The cut-out part of adhesion layer 222 is illustrated with a dashed line to show the outline only. FIG. 6B and FIG. 6C are cross-sectional views schematically illustrating the overall configuration of semiconductor laser device 210 according to the present embodiment. FIG. 6B and FIG. 6C illustrate cross sections taken at the VIB-VIB line and the VIC-VIC line shown in FIG. 6A, respectively.

As illustrated in FIG. 6B, semiconductor laser device 210 according to the present embodiment includes semiconductor laminate body 30, insulating layer 221, first electrode 25, second electrode 223, adhesion layer 222, and n-side electrode 28.

Insulating layer 221 is a dielectric layer that: is formed in the entire region of the upper surface of semiconductor laminate body 30; has first opening 227 extending in a first direction which is a direction from front end surface 36 toward rear end surface 37; and is disposed above semiconductor laminate body 30.

Second electrode 223 is an electrode disposed above first electrode 25 and insulating layer 221. Second electrode 223 is disposed above insulating layer 221 between first opening 227 and at least one of front end surface 36 or rear end surface 37. As illustrated in FIG. 6A, second electrode 223 is not disposed above front end surface 36 nor above rear end surface 37. The perimeter of first opening 227 of insulating layer 221 is located outside the perimeter of first electrode 25 at a distance of at least 0.1 μm and less than 10 μm from the perimeter of first electrode 25. Second electrode 223 is disposed so that its perimeter is located at a distance of at least 0.1 μm and less than 20 μm from front end surface 36 and rear end surface 37.

Adhesion layer 222 is a layer disposed between second electrode 223 and insulating layer 221. Adhesion layer 222 has second opening 226 that at least partially overlaps with first opening 227 in a plan view of adhesion layer 222. In the present embodiment, both the long sides and the short sides of the perimeter of first opening 227 are located outside the long sides and the short sides of the perimeter of second opening 226 in a plan view of adhesion layer 222. As illustrated in FIG. 6A, first electrode 25 is at least partially disposed inside first opening 227 and second opening 226 in a plan view of adhesion layer 222. This allows second electrode 223 to be in contact with first electrode 25 disposed inside first opening 227 and second opening 226. Note that in the present embodiment, the entirety of first electrode 25 is disposed inside first opening 227 and second opening 226 in a plan view of adhesion layer 222. Adhesion layer 222 is disposed above insulating layer 221 between first opening 227 and at least one of front end surface 36 or rear end surface 37. The perimeter of second opening 226 is located inside the perimeter of first opening 227 in the first direction and the second direction at a distance of, for example, at least 0.1 μm and less than 10 μm from the perimeter of first opening 227. Specifically, the perimeter of second opening 226 is located inside first opening 227 at a distance of 2.8 μm from the perimeter of first opening 227. The perimeter of adhesion layer 222 is located at a distance of 9 μm from front end surface 36 and at a distance of 9 μm from rear end surface 37. In addition, the perimeter of adhesion layer 222 is located at a distance of 6.6 μm from side end surfaces 38 of semiconductor laminate body 30. Specifically, the perimeter of adhesion layer 222 is located at a distance of at least 0.1 μm and less than 20 μm from at least one of front end surface 36 or rear end surface 37, and the perimeter of second opening 226 is located inside the perimeter of first opening 227 at a distance of at least 0.1 μm and less than 10 μm from the perimeter of first opening 227.

As illustrated in FIG. 6A, the perimeter of second electrode 223 is located inside the perimeter of adhesion layer 222 and outside second opening 226. Specifically, in the first direction, the perimeter of adhesion layer 222 is located at a distance of 9 μm from front end surface 36 and rear end surface 37, the perimeter of second electrode 223 is located at a distance of 10 μm from front end surface 36 and rear end surface 37, and the perimeter of second opening 226 is located at a distance of 37.8 μm from front end surface 36 and at a distance of 13.8 μm from rear end surface 37. In the second direction, the perimeter of adhesion layer 222 is located at a distance of 6.6 μm from side end surfaces 38 of semiconductor laminate body 30, the perimeter of second electrode 223 is located at a distance of 7.6 μm from side end surfaces 38, and the perimeter of second opening 226 is located at a distance of 70 μm from side end surfaces 38. Accordingly, as illustrated in FIG. 6B, second opening 226 is present in cross section VIB-VIB at half the length of adhesion layer 222 in the first direction from rear end surface 37, whereas, as illustrated in FIG. 6C, second opening 226 is not present in cross section VIC-VIC at a distance of at least 6.6 μm and at most 13.8 μm from rear end surface 37.

Semiconductor laser device 210 according to the present embodiment having the above-described configuration can produce an advantageous effect of inhibiting second electrode 223 from peeling as with semiconductor laser device 10 according to Embodiment 1.

Adhesion layer 222 according to the present embodiment is different from adhesion layer 22 according to Embodiment 1 in that, in a plan view of adhesion layer 222, each of the edges of second opening 226 is located inside the perimeter of first opening 227. This makes it possible to make the area of contact between adhesion layer 222 and second electrode 223 larger than that in semiconductor laser device 10 according to Embodiment 1. Accordingly, the present embodiment can further inhibit second electrode 223 from peeling. Note that, in a plan view of adhesion layer 222, each of the edges of second opening 226 may be located on the perimeter of first opening 227. Such a configuration also makes it possible to make the area of contact between adhesion layer 222 and second electrode 223 larger than that in semiconductor laser device 10 according to Embodiment 1, and thus, second electrode 223 can be inhibited from peeling.

Embodiment 4

The following describes a semiconductor laser device according to Embodiment 4. The semiconductor laser device according to the present embodiment is different from semiconductor laser device 10 according to Embodiment 1 in mainly the configuration of the adhesion layer. Hereinafter, the semiconductor laser device according to the present embodiment will be described with reference to FIG. 7A to FIG. 7F, focusing on the difference from semiconductor laser device 10 according to Embodiment 1.

Figure 7A:
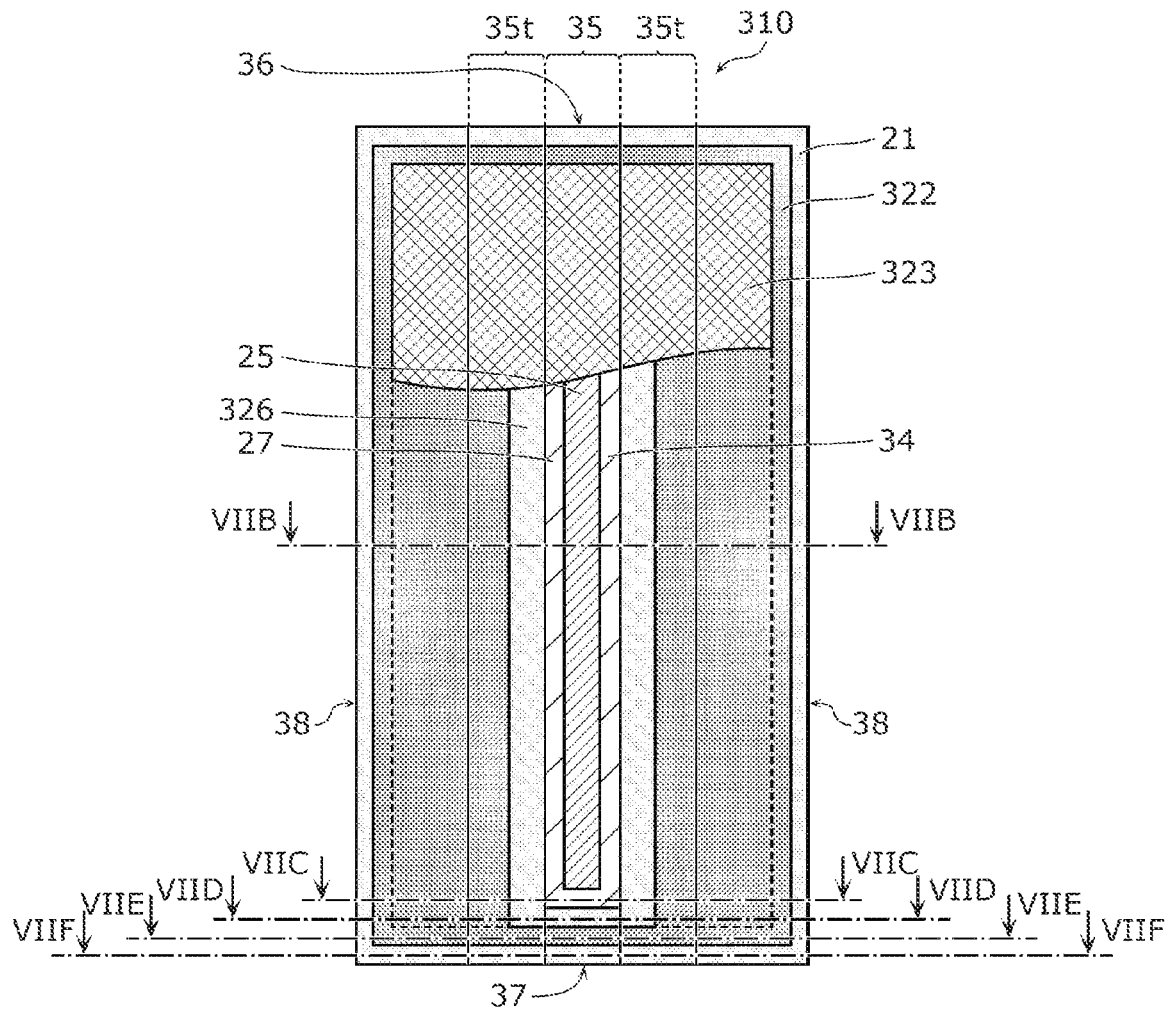
FIG. 7A is a plan view schematically illustrating an overall configuration of a semiconductor laser device according to Embodiment 4.

FIG. 7A is a plan view schematically illustrating an overall configuration of semiconductor laser device 310 according to the present embodiment. In FIG. 7A, second electrode 323 is partially cut out to show the configuration of, for example, adhesion layer 322. The cut-out part of second electrode 323 is illustrated with a dashed line to show the outline only. FIG. 7B to FIG. 7F are cross-sectional views schematically illustrating the overall configuration of semiconductor laser device 310 according to the present embodiment. FIG. 7B to FIG. 7F illustrate cross sections taken at the VIIB-VIIB line to the VIIF-VIIF line shown in FIG. 7A, respectively.

Figure 7B:
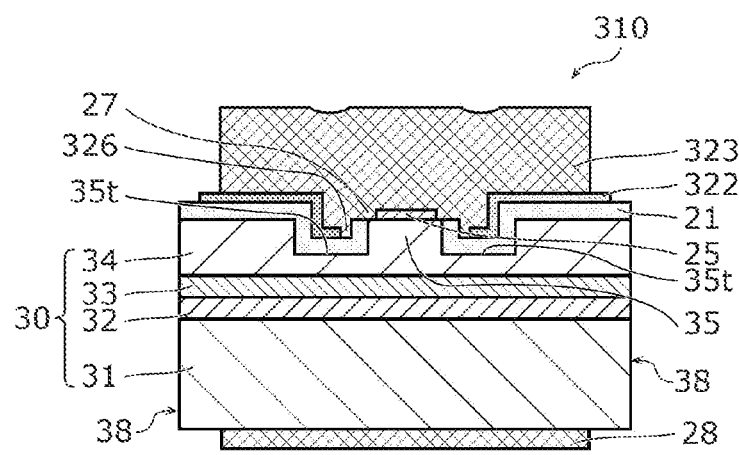
FIG. 7B is a first cross-sectional view schematically illustrating the overall configuration of the semiconductor laser device according to Embodiment 4.

As illustrated in FIG. 7B, semiconductor laser device 310 according to the present embodiment includes semiconductor laminate body 30, insulating layer 21, first electrode 25, second electrode 323, adhesion layer 322, and n-side electrode 28.

Second electrode 323 is an electrode disposed above first electrode 25 and insulating layer 21. Second electrode 323 is located above insulating layer 21 between first opening 27 of insulating layer 21 and at least one of front end surface 36 or rear end surface 37. As illustrated in FIG. 7A, second electrode 323 is disposed not to be in contact with front end surface 36 nor rear end surface 37. Specifically, the perimeter of second electrode 323 is located at a distance of at least 0.1 μm and less than 20 μm from front end surface 36 and rear end surface 37.

Adhesion layer 322 is a layer disposed between second electrode 323 and insulating layer 21. Adhesion layer 322 has second opening 326 that at least partially overlaps with first opening 27 in a plan view of adhesion layer 322. As illustrated in FIG. 7A, first electrode 25 is at least partially disposed inside first opening 27 and second opening 326 in a plan view of adhesion layer 322. In the present embodiment, both the long sides and the short sides of the perimeter of first opening 27 are located inside the long sides and the short sides of the perimeter of second opening 326 in a plan view of adhesion layer 322. This allows second electrode 323 to be in contact with first electrode 25 disposed inside first opening 27 and second opening 326. Note that in the present embodiment, the entirety of first electrode 25 is disposed inside first opening 27 and second opening 326 in a plan view of adhesion layer 322. Adhesion layer 322 is disposed above insulating layer 21 between first opening 27 and at least one of front end surface 36 or rear end surface 37. Specifically, the perimeter of adhesion layer 322 is located at a distance of at least 0.1 μm and less than 10 μm from at least one of front end surface 36 or rear end surface 37, and the perimeter of second opening 326 is located outside the perimeter of first opening 27 at a distance of at least 0.1 μm and less than 20 μm from the perimeter of first opening 27.

The perimeter of second opening 326 is located outside the perimeter of first opening 27 in the first direction and the second direction at a distance of, for example, at least 0.1 μm and less than 10 μm from the perimeter of first opening 27. Specifically, the perimeter of second opening 326 is located outside the perimeter of first opening 27 at a distance of 2.8 μm from the perimeter of first opening 27. The perimeter of adhesion layer 322 is located at a distance of 9 μm from front end surface 36 and at a distance of 9 μm from rear end surface 37. In addition, the perimeter of second electrode 322 is located at a distance of 6.6 μm from side end surfaces 38 of semiconductor laminate body 30. Specifically, the perimeter of adhesion layer 322 is located at a distance of at least 0.1 μm and less than 20 μm from at least one of front end surface 36 or rear end surface 37, and the perimeter of second opening 326 is located outside the perimeter of first opening 27 at a distance of at least 0.1 μm and less than 10 μm from the perimeter of first opening 27.

Figure 7C:
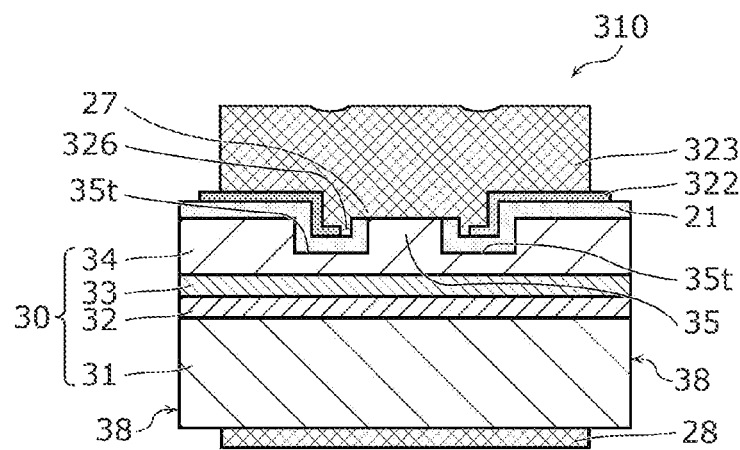
FIG. 7C is a second cross-sectional view schematically illustrating the overall configuration of the semiconductor laser device according to Embodiment 4.
Figure 7D:
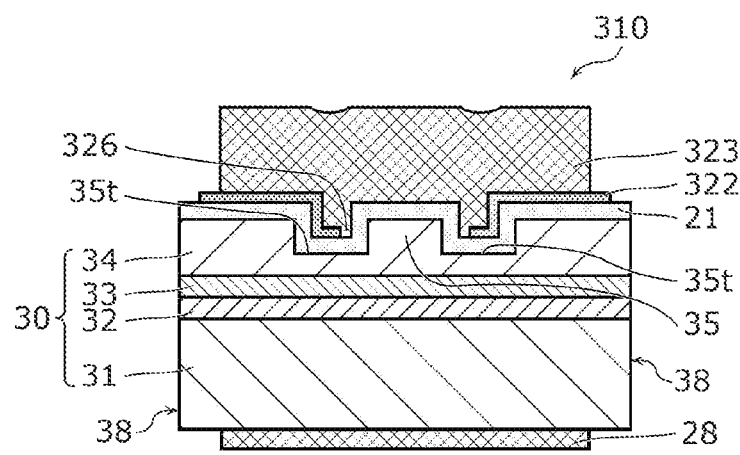
FIG. 7D is a third cross-sectional view schematically illustrating the overall configuration of the semiconductor laser device according to Embodiment 4.
Figure 7E:
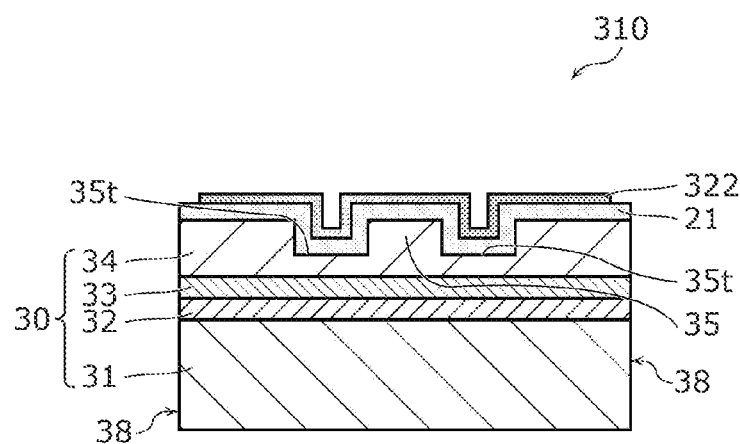
FIG. 7E is a fourth cross-sectional view schematically illustrating the overall configuration of the semiconductor laser device according to Embodiment 4.
Figure 7F:
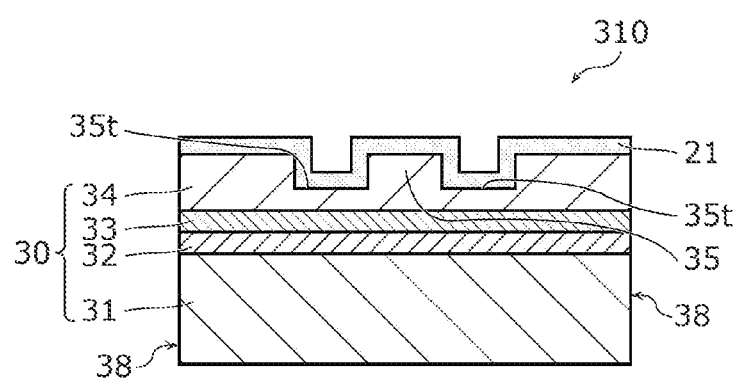
FIG. 7F is a fifth cross-sectional view schematically illustrating the overall configuration of the semiconductor laser device according to Embodiment 4.

As illustrated in FIG. 7A, the perimeter of second electrode 323 is located inside the perimeter of adhesion layer 322 and outside second opening 326. Specifically, in the first direction, the perimeter of adhesion layer 322 is located at a distance of 9 μm from front end surface 36 and rear end surface 37, the perimeter of second electrode 323 is located at a distance of 10 μm from front end surface 36 and rear end surface 37, and the perimeter of second opening 326 is located at a distance of 37.8 μm from front end surface 36 and at a distance of 13.8 μm from rear end surface 37. In the second direction, the perimeter of adhesion layer 322 is located at a distance of 6.6 μm from side end surfaces 38 of semiconductor laminate body 30, the perimeter of second electrode 323 is located at a distance of 7.6 μm from side end surfaces 38, and the perimeter of second opening 326 is located at a distance of 70 μm from side end surfaces 38. Accordingly, as illustrated in FIG. 7B, second opening 326, first opening 27, and first electrode 25 are present in cross section VIIB-VIIB at a half distance of the length of adhesion layer 322 in the first direction from rear end surface 37. As illustrated in FIG. 7C and FIG. 7D, in cross sections VIIC-VIIC and VIID-VIID at a distance of at least 7.6 μm and at most 13.8 μm from rear end surface 37, second opening 326 and first opening 27 are present in cross section VIIC-VIIC, whereas second opening 326 is present in cross section VIID-VIID. As illustrated in FIG. 7E, neither first opening 27 nor second opening 326 is present in cross section VIIE-VIIE at a distance of at least 6.6 μm and at most 7.6 μm from rear end surface 37. As illustrated in FIG. 7F, adhesion layer 322 is not present in cross section VIIF-VIIF at a distance of at most 6.6 μm from rear end surface 37.

Semiconductor laser device 310 according to the present embodiment having the above-described configuration can produce an advantageous effect of inhibiting second electrode 323 from peeling as with semiconductor laser device 10 according to Embodiment 1.

In the present embodiment, in a plan view of adhesion layer 322, an edge of second opening 326 adjacent to one end surface among front end surface 36 and rear end surface 37 is located between the one end surface and an edge of first opening 27 adjacent to the one end surface. This way, it is possible to dispose first electrode 25 up to the edge of first opening 27 closest to the end surface, without adhesion layer 322 and first electrode 25 coming into contact with one another. Accordingly, it is possible to inhibit an increase in the resistance value of semiconductor laser device 310, and maximize the area size of first electrode 25 in the vicinity of the end surfaces.

In the present embodiment, in a plan view of adhesion layer 322, all the edges of second opening 326 are located outside first opening 27. This way, it is possible to dispose first electrode 25 up to the edges of first opening 27 without adhesion layer 322 and first electrode 25 coming into contact with one another. Accordingly, it is possible to inhibit an increase in the resistance value of semiconductor laser device 310, and maximize the area size of first electrode 25 in the vicinity of the side end surfaces.

Embodiment 5

The following describes a semiconductor laser device according to Embodiment 5. The semiconductor laser device according to the present embodiment is different from semiconductor laser device 10 according to Embodiment 1 in mainly the configuration of the first electrode. Hereinafter, the semiconductor laser device according to the present embodiment will be described with reference to FIG. 8A and FIG. 8B, focusing on the difference from semiconductor laser device 10 according to Embodiment 1.

Figure 8A:
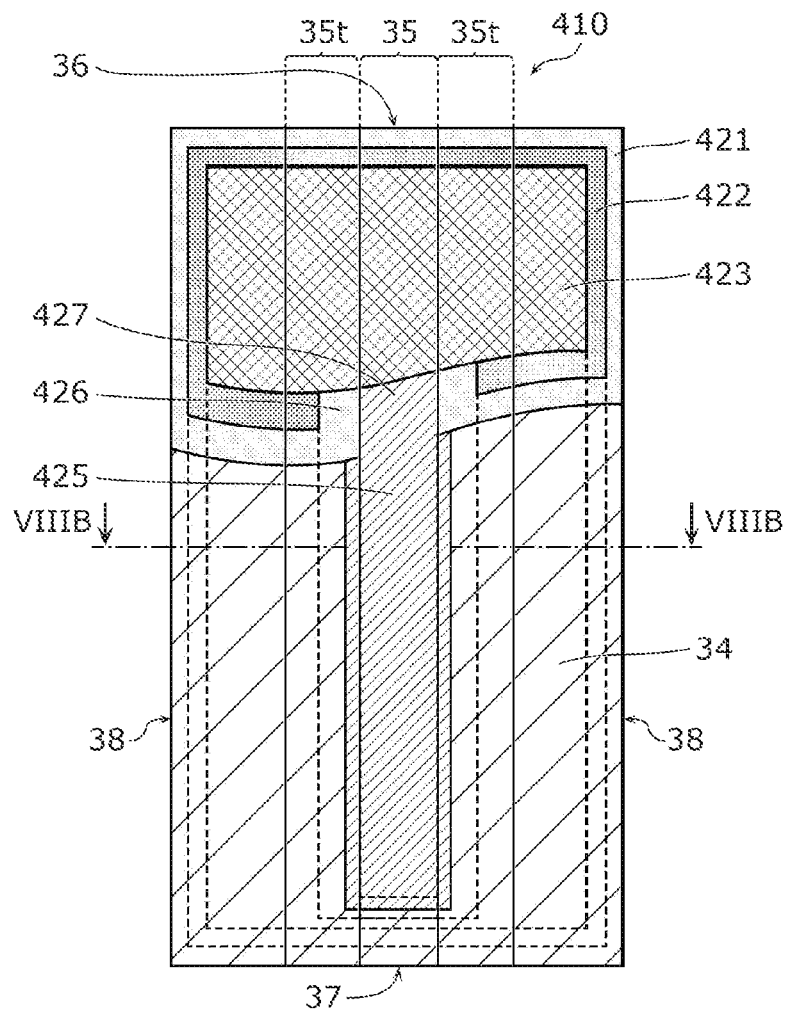
FIG. 8A is a plan view schematically illustrating an overall configuration of a semiconductor laser device according to Embodiment 5.
Figure 8B:
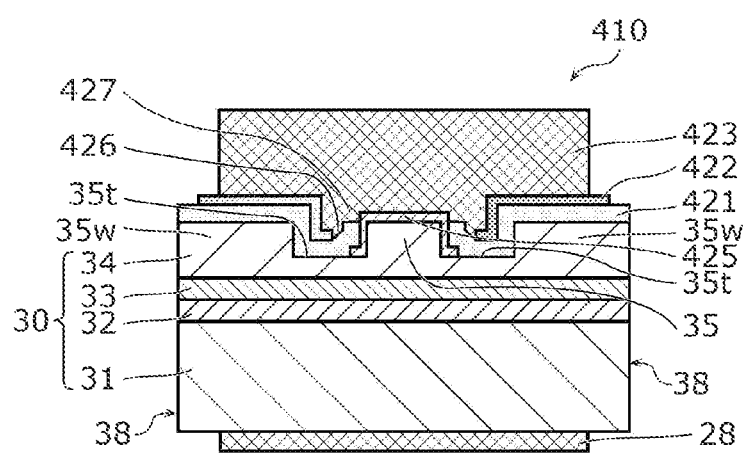
FIG. 8B is a cross-sectional view schematically illustrating the overall configuration of the semiconductor laser device according to Embodiment 5.

FIG. 8A is a plan view schematically illustrating an overall configuration of semiconductor laser device 410 according to the present embodiment. In FIG. 8A, second electrode 423 is partially cut out to show the configuration of, for example, adhesion layer 422. The cut-out part of second electrode 423 is illustrated with a dashed line to show the outline only. Furthermore, in FIG. 8A, insulating layer 421 is partially cut out to show the configuration of first electrode 425. The cut-out part of insulating layer 421 is illustrated with a dashed line to show the outline only. FIG. 8B is a cross-sectional view schematically illustrating the overall configuration of semiconductor laser device 410 according to the present embodiment. FIG. 8B illustrates a cross section taken at the VIIIB-VIIIB line shown in FIG. 8A.

As illustrated in FIG. 8B, semiconductor laser device 410 according to the present embodiment includes semiconductor laminate body 30, insulating layer 421, first electrode 425, second electrode 423, adhesion layer 422, and n-side electrode 28.

As illustrated in FIG. 8B, first electrode 425 covers, not only the upper surface of ridge portion 35, but also at least part of the side surfaces of ridge portion 35. In addition, first electrode 425 covers, of the upper surface of p-type semiconductor layer 34, at least part of grooves 35t located between ridge portion 35 and protruding portions 35w having the same height as ridge portion 35. The at least part of grooves 35t covered by first electrode 425 is located closer to ridge portion 35 than to protruding portions 35w.

Insulating layer 421 is a dielectric layer that: is formed in the entire region of the upper surface of semiconductor laminate body 30; has first opening 427 extending in a first direction which is a direction from front end surface 36 toward rear end surface 37; and is disposed above semiconductor laminate body 30. As illustrated in FIG. 8A, in a plan view of adhesion layer 422, the upper surface of ridge portion 35 is at least partially disposed inside first opening 427. Further, as illustrated in FIG. 8A and FIG. 8B, insulating layer 421 is at least partially disposed on first electrode 425. More specifically, insulating layer 421 is disposed in: of the upper surface of first electrode 425, side regions located on the side surfaces of ridge portion 35; and regions located outside the side regions. The entirety of the perimeter of first opening 427 is on first electrode 425. To realize first electrode 425 and insulating layer 421 according to the present embodiment, first electrode 425 is formed earlier than insulating layer 421 in the manufacturing of semiconductor laser device 410. Specifically, the perimeter of first electrode 425 is located outside the perimeter of first opening 427 at a distance of at least 0.1 µm and less than 10 µm from the perimeter of first opening 427.

Second electrode 423 is an electrode disposed above first electrode 425 and insulating layer 421. Second electrode 423 is disposed above insulating layer 421 between first opening 427 of insulating layer 421 and at least one of front end surface 36 or rear end surface 37. As illustrated in FIG. 8A, second electrode 423 is not disposed above front end surface 36 nor above rear end surface 37. Specifically, the perimeter of second electrode 423 is located at a distance of at least 0.1 µm and less than 20 µm from front end surface 36 and rear end surface 37.

Adhesion layer 422 is a layer disposed between second electrode 423 and insulating layer 421. Adhesion layer 422 has second opening 426 that at least partially overlaps with first opening 427 in a plan view of adhesion layer 422. As illustrated in FIG. 8A, first electrode 425 is at least partially disposed inside first opening 427 and second opening 426 in a plan view of adhesion layer 422. This allows second electrode 423 to be in contact with first electrode 425 disposed inside first opening 427 and second opening 426. Adhesion layer 422 is disposed above insulating layer 421 between first opening 427 and at least one of front end surface 36 or rear end surface 37. Specifically, the perimeter of adhesion layer 422 is located at a distance of at least 0.1 µm and less than 20 µm from at least one of front end surface 36 or rear end surface 37, and the perimeter of second opening 426 is located at a distance of at least 0.1 µm and less than 20 µm from the perimeter of first opening 427.

Semiconductor laser device 410 according to the present embodiment having the above-described configuration can produce an advantageous effect of inhibiting second electrode 423 from peeling as with semiconductor laser device 10 according to Embodiment 1.

Embodiment 6

The following describes a semiconductor laser device according to Embodiment 6. The semiconductor laser device according to the present embodiment is different from semiconductor laser device 10 according to Embodiment 1 in mainly the configuration of the insulating layer. Hereinafter, the semiconductor laser device according to the present embodiment will be described with reference to FIG. 9A and FIG. 9B, focusing on the difference from semiconductor laser device 10 according to Embodiment 1.

Figure 9A:
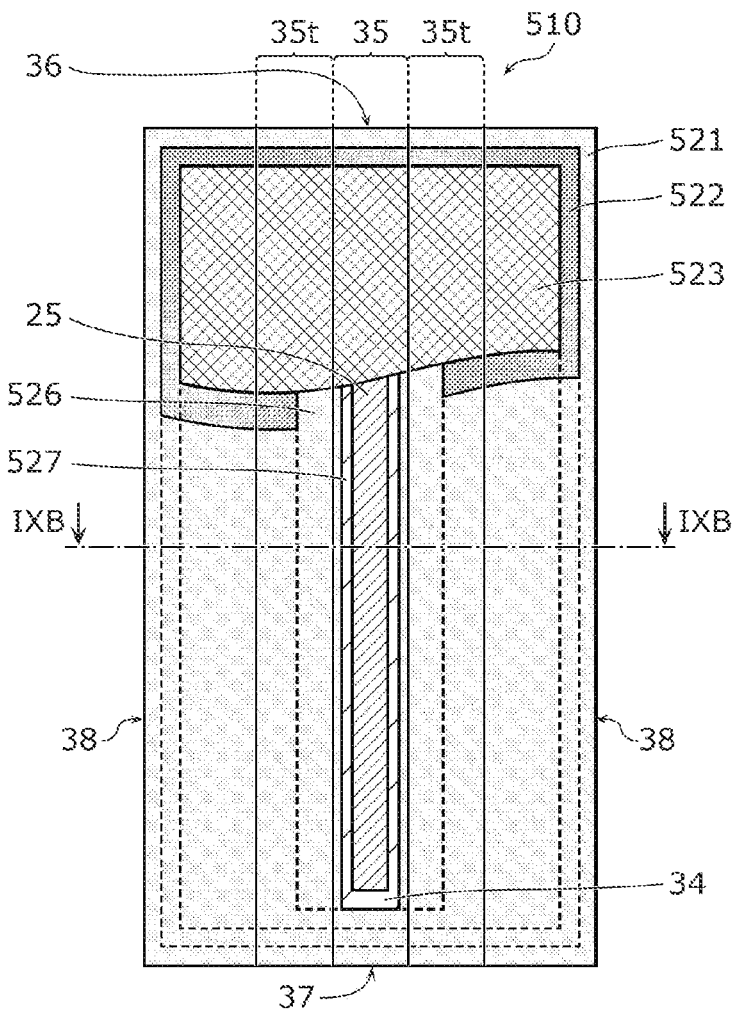
FIG. 9A is a plan view schematically illustrating an overall configuration of a semiconductor laser device according to Embodiment 6.
Figure 9B:
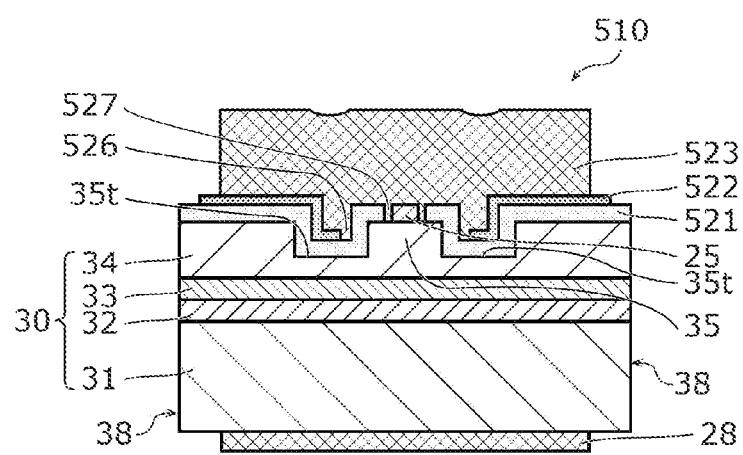
FIG. 9B is a cross-sectional view schematically illustrating the overall configuration of the semiconductor laser device according to Embodiment 6.

FIG. 9A is a plan view schematically illustrating an overall configuration of semiconductor laser device 510 according to the present embodiment. In FIG. 9A, second electrode 523 is partially cut out to show the configuration of, for example, adhesion layer 522. The cut-out part of second electrode 523 is illustrated with a dashed line to show the outline only. Furthermore, in FIG. 9A, adhesion layer 522 is partially cut out to show the configuration of insulating layer 521. The cut-out part of adhesion layer 522 is illustrated with a dashed line to show the outline only. FIG. 9B is a cross-sectional view schematically illustrating the overall configuration of semiconductor laser device 510 according to the present embodiment. FIG. 9B illustrates a cross section taken at the IXB-IXB line shown in FIG. 9A.

As illustrated in FIG. 9B, semiconductor laser device 510 according to the present embodiment includes semiconductor laminate body 30, insulating layer 521, first electrode 25, second electrode 523, adhesion layer 522, and n-side electrode 28.

Insulating layer 521 is a dielectric layer that: is formed in the entire region of the upper surface of semiconductor laminate body 30; has first opening 527 extending in a first direction which is a direction from front end surface 36 toward rear end surface 37; and is disposed above semiconductor laminate body 30. As illustrated in FIG. 9A, in a plan view of adhesion layer 522, the upper surface of ridge portion 35 is at least partially located inside first opening 527. In the present embodiment, as illustrated in FIG. 9A and FIG. 9B, insulating layer 521 is disposed in, of the upper surface of ridge portion 35, regions in the vicinity of the side surfaces of ridge portion 35. Specifically, the perimeter of first opening 527 of insulating layer 521 is located outside the perimeter of first electrode 25 at a distance of at least 0.1 μm and less than 10 μm from the perimeter of first electrode 25. The perimeter of first opening 527 is located on the upper surface of ridge portion 35 and at a distance of at least 0.5 μm and less than 2 μm from positions at which the upper surface and the side surfaces of ridge portion 35 come into contact (that is, the corners of ridge portion 35). Further, the perimeter of first opening 527 is located outside the perimeter of first electrode 25 at a distance of at least 0.1 μm and less than 1 μm from the perimeter of first electrode 25.

Figure 9C:
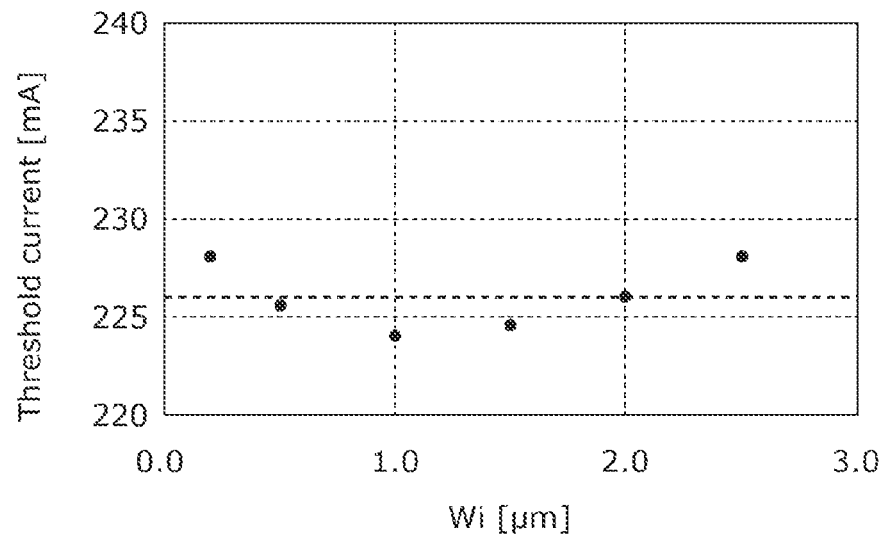
FIG. 9C is a graph illustrating a relationship between a threshold current of the semiconductor laser device according to Embodiment 6 and a distance from a first electrode to a position where a side surface and the upper surface of a ridge portion come into contact.
Figure 9D:
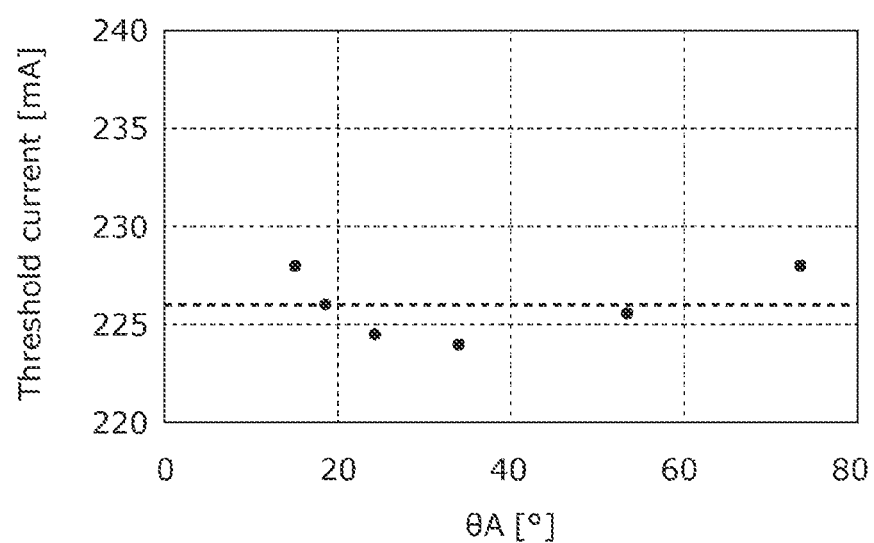
FIG. 9D is a graph illustrating a relationship between the threshold current of the semiconductor laser device according to Embodiment 6 and a depression angle of the insulating layer.

Hereinafter, a relationship between the position of the perimeter of first opening 527 and a threshold current will be described with reference to FIG. 9C and FIG. 9D. FIG. 9C is a graph illustrating a relationship between the threshold current of semiconductor laser device 510 according to the present embodiment and distance Wi from first electrode 25 to the position where the side surface and the upper surface of ridge portion 35 come into contact, and FIG. 9D is a graph illustrating a relationship between the threshold current and depression angle θA. Here, distance Wi refers to the distance from first electrode 25 (that is, an end portion of first electrode 25 closer to the side surface of ridge portion 35) to the corner of ridge portion 35. Depression angle θA is an angle (°) corresponding to arctan (Hr/Wi), where Hr denotes the height of ridge portion 35. In the present embodiment, since height Hr of ridge portion 35 is 680 nm (0.68 μm), depression angle θA is approximately 54° and approximately 19° when distance Wi is 0.5 μm and 2.0 μm, respectively, for example.

When distance Wi is small, current (that is, carriers) concentrates in the vicinities of the side surfaces of ridge portion 35, thus causing an increase in the light density in the vicinities of the side surfaces of ridge portion 35. In such regions with a high light density, the light amplification gain decreases due to hole burning, thus making the laser oscillation difficult. This causes an increase in the threshold current of semiconductor laser device 510. Accordingly, in the present embodiment, the threshold current increases when Wi<0.5 μm, that is, θA>54° as illustrated in FIG. 9C and FIG. 9D.

On the other hand, when distance Wi is too large, current does not easily diffuse to the vicinities of the side surfaces of ridge portion 35, and thus, the distribution width of injection current becomes narrower than the width of light distribution in the width direction of the active layer. Since this reduces interaction between light and carriers, the light amplification gain decreases and the laser oscillation becomes difficult. Accordingly, the threshold current increases when Wi>2.0 μm, that is, θA<19° as illustrated in FIG. 9C and FIG. 9D.

In view of the above, semiconductor laser device 510 according to the present embodiment can reduce the threshold current when 0.5 μm≤Wi≤2.0 μm, that is, 19°≤θA≤54°. With the reduction in the threshold current of semiconductor laser device 510, it is possible to inhibit a rise in temperature during operation of semiconductor laser device 510, thus increasing the long-term reliability of semiconductor laser device 510. In particular, in the present embodiment, the threshold current can be at minimum when Wi=1.0 μm, that is, θA=34°.

Second electrode 523 is an electrode disposed above first electrode 525 and insulating layer 521. Second electrode 523 is disposed above insulating layer 521 between first opening 527 of insulating layer 521 and at least one of front end surface 36 or rear end surface 37. As illustrated in FIG. 9A, second electrode 523 is not disposed above front end surface 36 nor above rear end surface 37. Specifically, the perimeter of second electrode 523 is located at a distance of at least 0.1 μm and less than 20 μm from front end surface 36 and rear end surface 37.

Adhesion layer 522 is a layer disposed between second electrode 523 and insulating layer 521. Adhesion layer 522 has second opening 526 that at least partially overlaps with first opening 527 in a plan view of adhesion layer 522. As illustrated in FIG. 9A, first electrode 25 is at least partially disposed inside first opening 527 and second opening 526 in a plan view of adhesion layer 522. This allows second electrode 523 to be in contact with first electrode 25 disposed inside first opening 527 and second opening 526. Adhesion layer 522 is disposed above insulating layer 521 between first opening 527 and at least one of front end surface 36 or rear end surface 37. Specifically, the perimeter of adhesion layer 522 is located at a distance of at least 0.1 μm and less than 20 μm from at least one of front end surface 36 or rear end surface 37, and the perimeter of second opening 526 is located outside the perimeter of first opening 527 at a distance of at least 0.1 μm and less than 20 μm from the perimeter of first opening 527.

Semiconductor laser device 510 according to the present embodiment having the above-described configuration can produce an advantageous effect of inhibiting second electrode 523 from peeling as with semiconductor laser device 10 according to Embodiment 1.

Variation of Embodiment 6

The following describes a semiconductor laser device according to a variation of Embodiment 6. The semiconductor laser device according to the present variation is different from semiconductor laser device 510 according to Embodiment 6 in configurations of the first electrode and the second electrode and in that grooves 30T are formed. Hereinafter, the semiconductor laser device according to the present variation will be described with reference to FIG. 9E and FIG. 9F, focusing on the differences from semiconductor laser device 510 according to Embodiment 6.

Figure 9E:
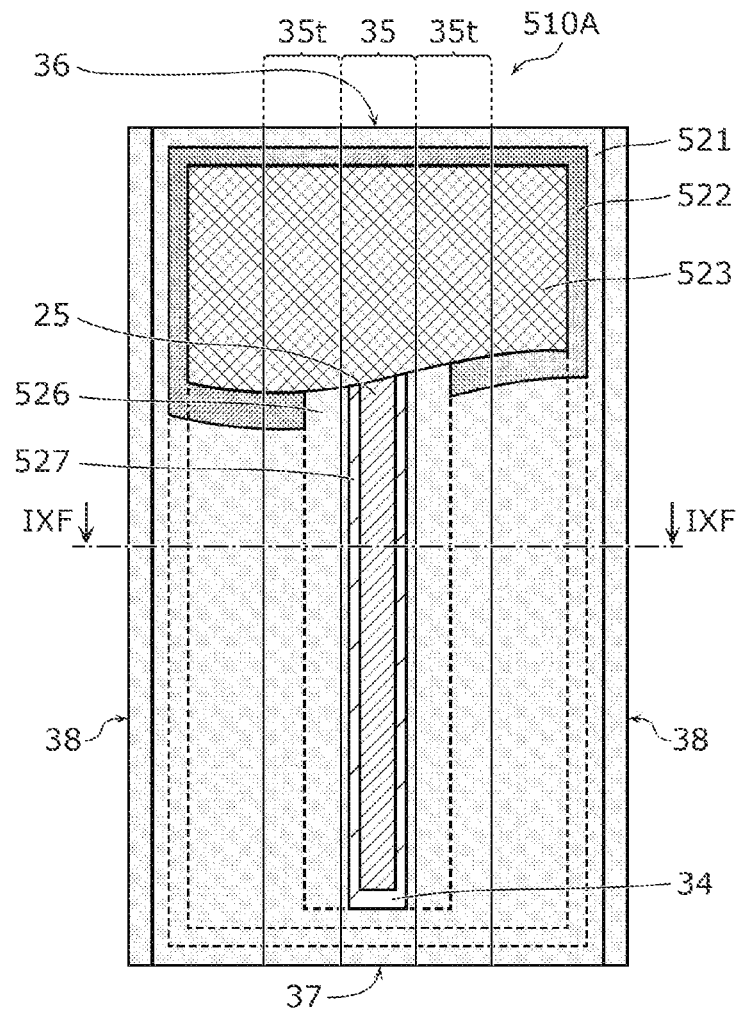
FIG. 9E is a plan view schematically illustrating an overall configuration of a semiconductor laser device according to a variation of Embodiment 6.
Figure 9F:
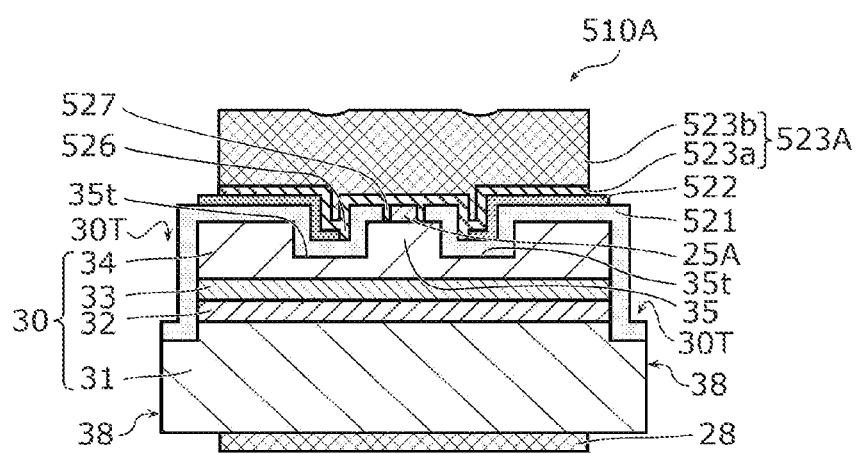
FIG. 9F is a cross-sectional view schematically illustrating the overall configuration of the semiconductor laser device according to the variation of Embodiment 6.

FIG. 9E is a plan view schematically illustrating an overall configuration of semiconductor laser device 510A according to the present variation. In FIG. 9E, second electrode 523 is partially cut out to show the configuration of, for example, adhesion layer 522. The cut-out part of second electrode 523 is illustrated with a dashed line to show the outline only. Furthermore, in FIG. 9E, adhesion layer 522 is partially cut out to show the configuration of insulating layer 521. The cut-out part of adhesion layer 522 is illustrated with a dashed line to show the outline only. FIG. 9F is a cross-sectional view schematically illustrating the overall configuration of semiconductor laser device 510A according to the present variation. FIG. 9F illustrates a cross section taken at the IXF-IXF line shown in FIG. 9E.

As illustrated in FIG. 9F, semiconductor laser device 510A according to the present variation includes semiconductor laminate body 30, insulating layer 521, first electrode 25A, second electrode 523A, adhesion layer 522, and n-side electrode 28.

As illustrated in FIG. 9E and FIG. 9F, adhesion layer 522 of semiconductor laser device 510A according to the present variation has the same configuration as adhesion layer 522 of semiconductor laser device 510 according to Embodiment 6.

As illustrated in FIG. 9F, grooves 30T are formed at both side end surfaces 38 of semiconductor laminate body 30 included in semiconductor laser device 510A according to the present variation. Grooves 30T are the cut-out parts extending from the upper surface of semiconductor laminate body 30 to a partway point on substrate 31. Insulating layer 521 is formed in grooves 30T.

In the present variation, first electrode 25A has a monolayer structure. Specifically, first electrode 25A is a Pd film having a thickness of 40 nm.

In the present variation, second electrode 523A includes first conductive film 523a and second conductive film 523b. First conductive film 523a is a Cr film having a thickness of 100 nm, and conductive film 523b is an Au film having a thickness of 1.6 μm.

Semiconductor laser device 510A having the above-described configuration can produce the same advantageous effect as that of semiconductor laser device 510 according to Embodiment 6.

Furthermore, in the present variation, second electrode 523A includes first conductive film 523a which is formed with a Cr film. First conductive film 523a is an example of a barrier layer disposed on a surface of second electrode 523A facing the semiconductor laminate body. With this, when second electrode 523A is mounted on, for example, a submount by using a joining material such as AuSn solder, first conductive film 523a formed with a Cr film functions as a barrier that blocks diffusion of Sn included in the AuSn solder. Accordingly, it is possible to inhibit diffusion of Sn to adhesion layer 522, for example.

Embodiment 7

The following describes a semiconductor laser device according to Embodiment 7. The semiconductor laser device according to the present embodiment is different from semiconductor laser device 310 according to Embodiment 4 mainly in that a submount joined to the second electrode is included. Hereinafter, the semiconductor laser device according to the present embodiment will be described with reference to FIG. 10A to FIG. 10C, focusing on the difference from semiconductor laser device 310 according to Embodiment 4.

Figure 10A:
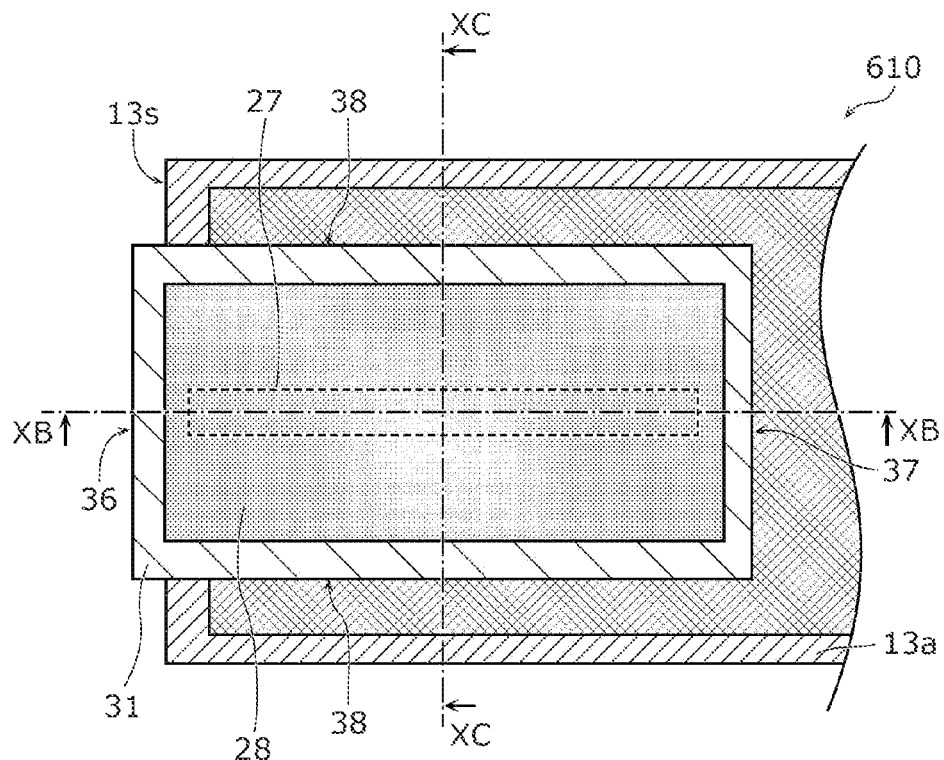
FIG. 10A is a plan view schematically illustrating an overall configuration of a semiconductor laser device according to Embodiment 7.
Figure 10B:
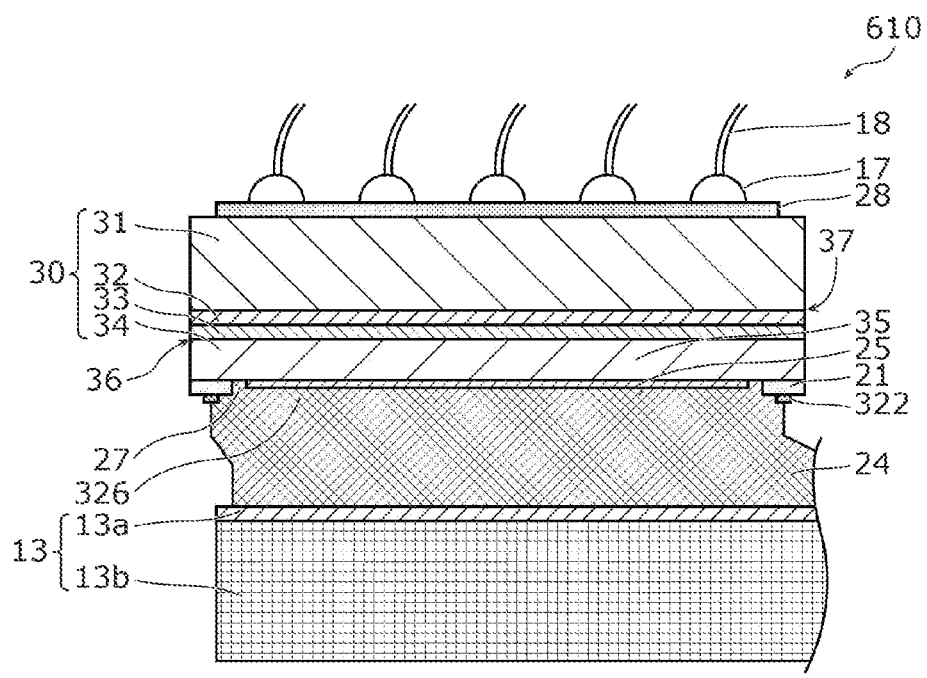
FIG. 10B is a first cross-sectional view schematically illustrating the overall configuration of the semiconductor laser device according to Embodiment 7.
Figure 10C:
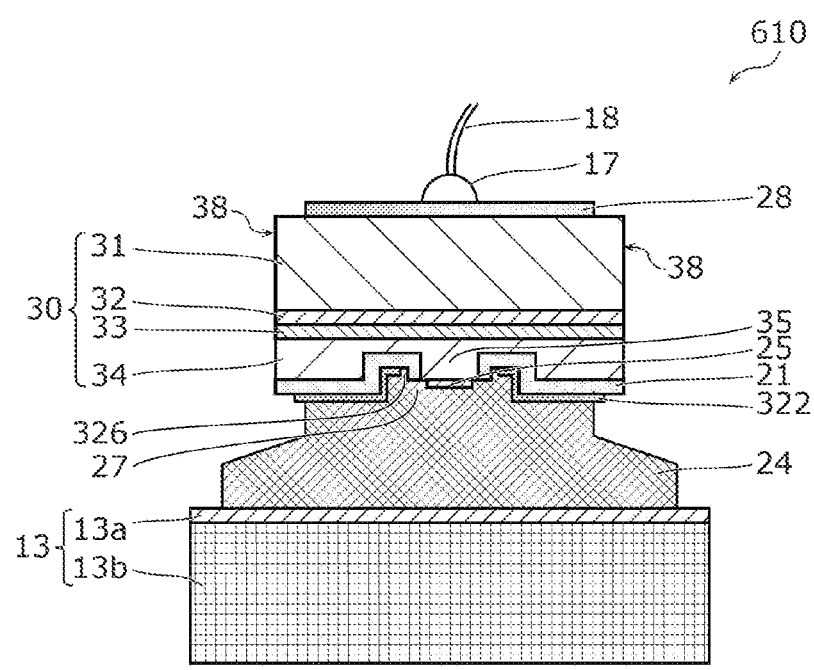
FIG. 10C is a second cross-sectional view schematically illustrating the overall configuration of the semiconductor laser device according to Embodiment 7.

FIG. 10A, FIG. 10B, and FIG. 10C are a plan view, a first cross-sectional view, and a second cross-sectional view, respectively, that schematically illustrate the overall configuration of semiconductor laser device 610 according to the present embodiment. FIG. 10B and FIG. 10C illustrate cross sections taken at the XB-XB line and the XC-XC line shown in FIG. 10A, respectively.

As illustrated in FIG. 10B and FIG. 10C, semiconductor laser device 610 according to the present embodiment includes semiconductor laminate body 30, insulating layer 21, first electrode 25, second electrode 24, adhesion layer 322, n-side electrode 28, and submount 13. Note that FIG. 10B and FIG. 10C illustrate: wires 18 that are bonded to n-side electrode 28; and metal balls 17 that join wires 18 and n-side electrode 28.

Adhesion layer 322 is a layer having the same configuration as adhesion layer 322 according to Embodiment 4.

Second electrode 24 is an electrode disposed above (below in FIG. 10B and FIG. 10C) first electrode 25 and insulating layer 21. Second electrode 24 is disposed between first opening 27 and at least one of front end surface 36 or rear end surface 37. Second electrode 24 is disposed not to be in contact with at least one of front end surface 36 or rear end surface 37. As illustrated in FIG. 10A and FIG. 10B, in the present embodiment, second electrode 24 is disposed not to be in contact with front end surface 36 nor rear end surface 37. Specifically, the perimeter of second electrode 24 is located at a distance of at least 0.1 μm and less than 20 μm from front end surface 36 and rear end surface 37.

In the present embodiment, second electrode 24 joins submount 13 with, for example, second electrode 24, semiconductor laminate body 30, first electrode 25, and adhesion layer 322. Second electrode 24 includes, for example, an alloy containing Au. More specifically, second electrode 24 is an alloy such as AuSn.

Submount 13 is a mounting component that functions as a heat sink. In the present embodiment, submount 13 includes metal layer 13a and base 13b. Metal layer 13a is a layer including metal. The metal that forms metal layer 13a is not particularly limited. Metal layer 13a is a metal film formed by, for example, laminating Ti, Pt, and Au in the stated order from base 13b. Base 13b is a bulk component that constitutes a large part of submount 13. In the present embodiment, base 13b has a rectangular parallelepiped shape. The material that forms base 13b is not particularly limited. In the present embodiment, base 13b is a polycrystalline SiC substrate. Note that base 13b may be a Si or AlN substrate, or may be a monocrystalline SiC or diamond substrate to enhance heat dissipation.

Semiconductor laser device 610 according to the present embodiment can be manufactured by, for example, joining submount 13 and semiconductor laser device 310 according to Embodiment 4 described above, using solder that includes AuSn. More specifically, semiconductor laser device 610 according to the present embodiment can be manufactured by forming an AuSn solder layer on metal layer 13a of submount 13, and junction-down mounting semiconductor laser device 310 on submount 13 (that is, by joining second electrode 323 of semiconductor laser device 310 and submount 13 using the AuSn solder layer). At this time, the AuSn solder layer and second electrode 323 that includes Au are alloyed, thereby forming second electrode 24 that includes AuSn.

By including submount 13 that is joined to second electrode 24 as described above, semiconductor laser device 610 according to the present embodiment can efficiently dissipate heat generated in, for example, active layer 33. Accordingly, the adverse effect of the heat in active layer 33 can be reduced.

As illustrated in FIG. 10A, in semiconductor laser device 610 according to the present embodiment, submount 13 may include end surface 13s that intersects with the first direction, and end surface 13s may be located between front end surface 36 and first opening 27 in a plan view of adhesion layer 322.

As described above, since front end surface 36 is located in a more outward position than end surface 13s of submount 13 in a plan view of insulating layer 21, it is possible to inhibit submount 13 from scattering laser light emitted from semiconductor laser device 610. Specifically, front end surface 36 protrudes from end surface 13s of submount 13 by a distance of at least 0.1 μm and less than 20 μm. In a plan view of insulating layer 21, first opening 27 is located at a position overlapping with submount 13. Here, the inner region of first opening 27 of insulating layer 21 is a region in which first electrode 25 is disposed, and current is confined to this region. Thus, of the region of semiconductor laminate body 30, this region has the greatest amount of heat generation. In the present embodiment, since the inner region of first opening 27 having the greatest amount of heat generation overlaps with submount 13 in a plan view of insulating layer 21, it is possible to ensure heat dissipation from semiconductor laminate body 30 to submount 13.

Embodiment 8

The following describes a semiconductor laser device according to Embodiment 8. The semiconductor laser device according to the present embodiment is different from semiconductor laser device 610 according to Embodiment 7 in mainly how the submount and the second electrode are joined. Hereinafter, the semiconductor laser device according to the present embodiment will be described with reference to FIG. 11A to FIG. 11C, focusing on the difference from semiconductor laser device 610 according to Embodiment 7.

Figure 11A:
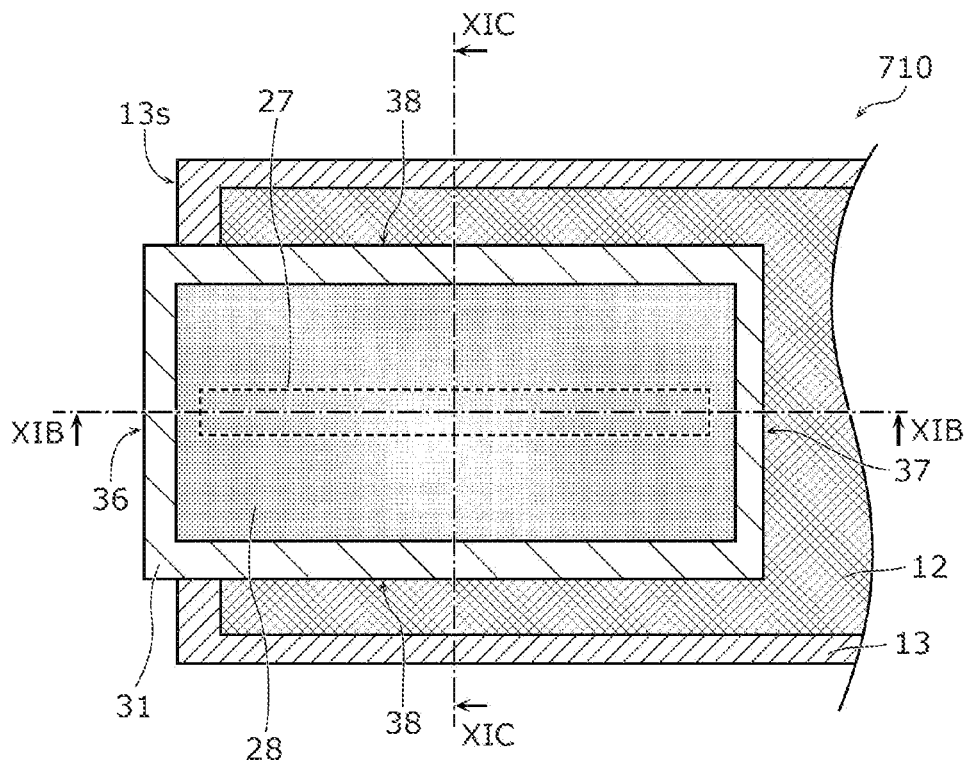
FIG. 11A is a plan view schematically illustrating an overall configuration of a semiconductor laser device according to Embodiment 8.
Figure 11B:
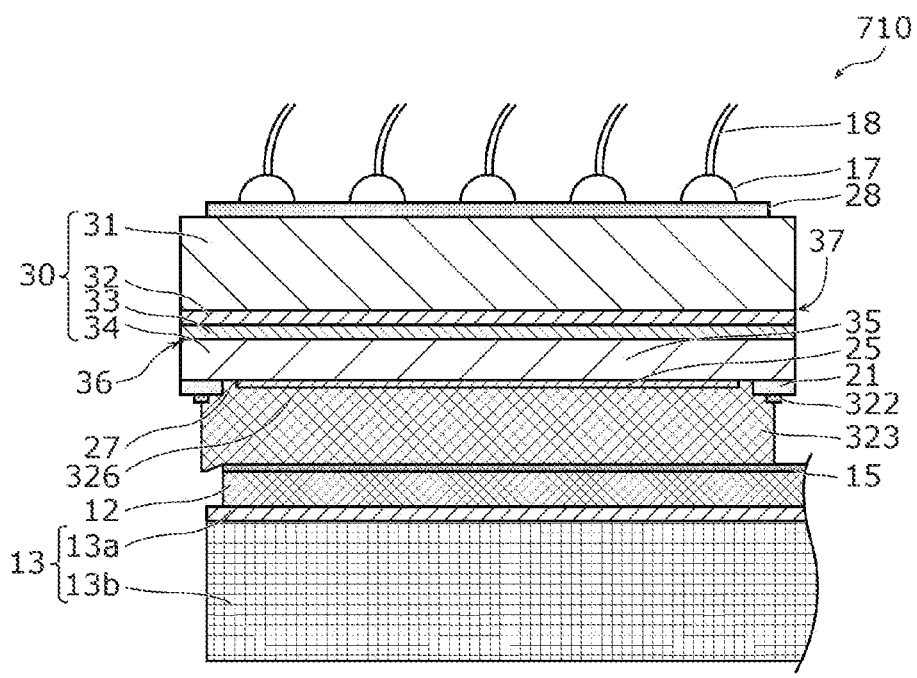
FIG. 11B is a first cross-sectional view schematically illustrating the overall configuration of the semiconductor laser device according to Embodiment 8.
Figure 11C:
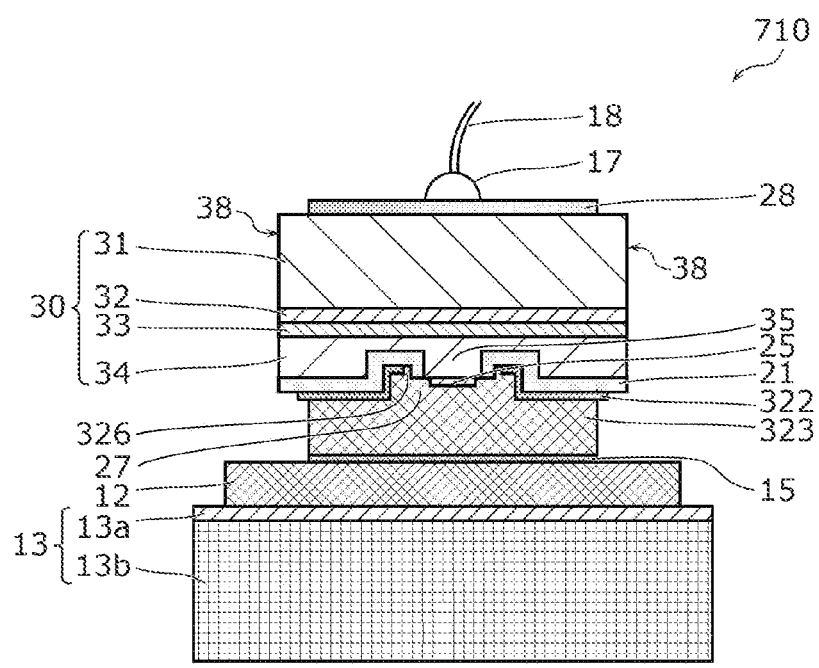
FIG. 11C is a second cross-sectional view schematically illustrating the overall configuration of the semiconductor laser device according to Embodiment 8.

FIG. 11A, FIG. 11B, and FIG. 11C are a plan view, a first cross-sectional view, and a second cross-sectional view, respectively, that schematically illustrate the overall configuration of semiconductor laser device 710 according to the present embodiment. FIG. 11B and FIG. 11C illustrate cross sections taken at the XIB-XIB line and the XIC-XIC line shown in FIG. 11A, respectively.

As illustrated in FIGS. 11B and 11C, semiconductor laser device 710 according to the present embodiment includes semiconductor laminate body 30, insulating layer 21, first electrode 25, second electrode 323, adhesion layer 322, n-side electrode 28, submount 13, solder layer 12, and separating layer 15. Note that FIG. 11B and FIG. 11C illustrate: wires 18 that are bonded to n-side electrode 28; and metal balls 17 that join wires 18 and n-side electrode 28.

In the present embodiment, second electrode 323 has the same configuration as second electrode 323 according to Embodiment 4. Second electrode 323 joins separating layer 15 with, for example, semiconductor laminate body 30, first electrode 25, and adhesion layer 322.

Solder layer 12 is a layer that joins submount 13 with, for example, second electrode 323. Solder layer 12 is formed on metal layer 13a of submount 13, using AuSn solder, for example.

Separating layer 15 is a layer disposed between solder layer 12 and second electrode 323, and separates solder layer 12 and second electrode 323. By including separating layer 15, it is possible to inhibit second electrode 323 and solder layer 12 from becoming integrated. Separating layer 15 is formed from Pt, for example.

Semiconductor laser device 710 according to the present embodiment having the above-described configuration can produce the same advantageous effect as that of semiconductor laser device 610 according to Embodiment 7 described above.

Variations 1 and 2 of Embodiment 8

The following describes semiconductor laser devices according to Variations 1 and 2 of Embodiment 8. The semiconductor laser device according to Variation 1 of Embodiment 8 is different from semiconductor laser device 710 according to Embodiment 8 in that semiconductor laser device 510A according to the variation of Embodiment 6 is used. The semiconductor laser device according to Variation 2 of Embodiment 8 is different from the semiconductor laser device according to Variation 1 of Embodiment 8 in that adhesion layer 522 is not included. Hereinafter, the semiconductor laser devices according to Variations 1 and 2 of Embodiment 8 will be described with reference to FIG. 11D to FIG. 11F, focusing on the differences from semiconductor laser device 710 according to Embodiment 8.

Figure 11D:
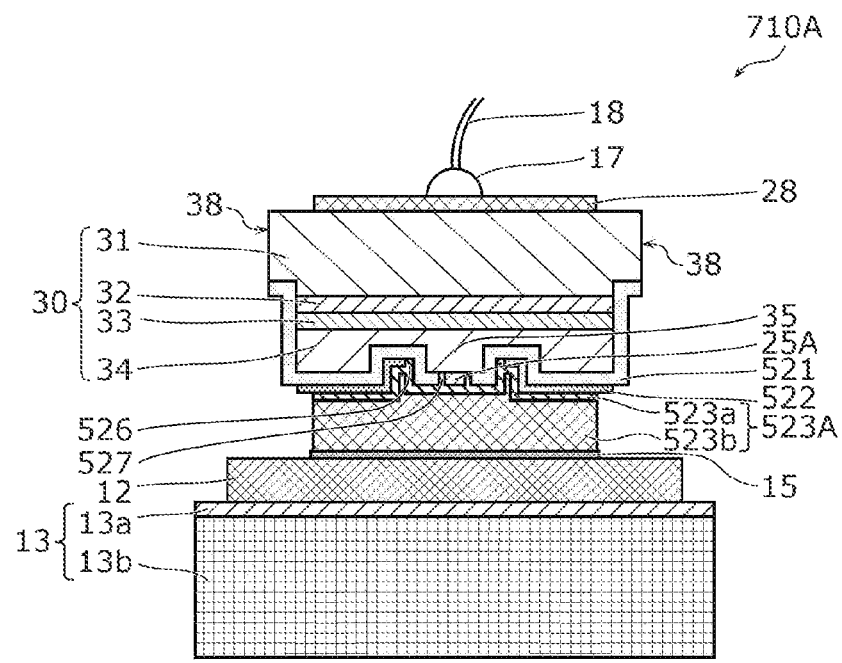
FIG. 11D is a first cross-sectional view schematically illustrating an overall configuration of a semiconductor laser device according to Variation 1 of Embodiment 8.
Figure 11E:
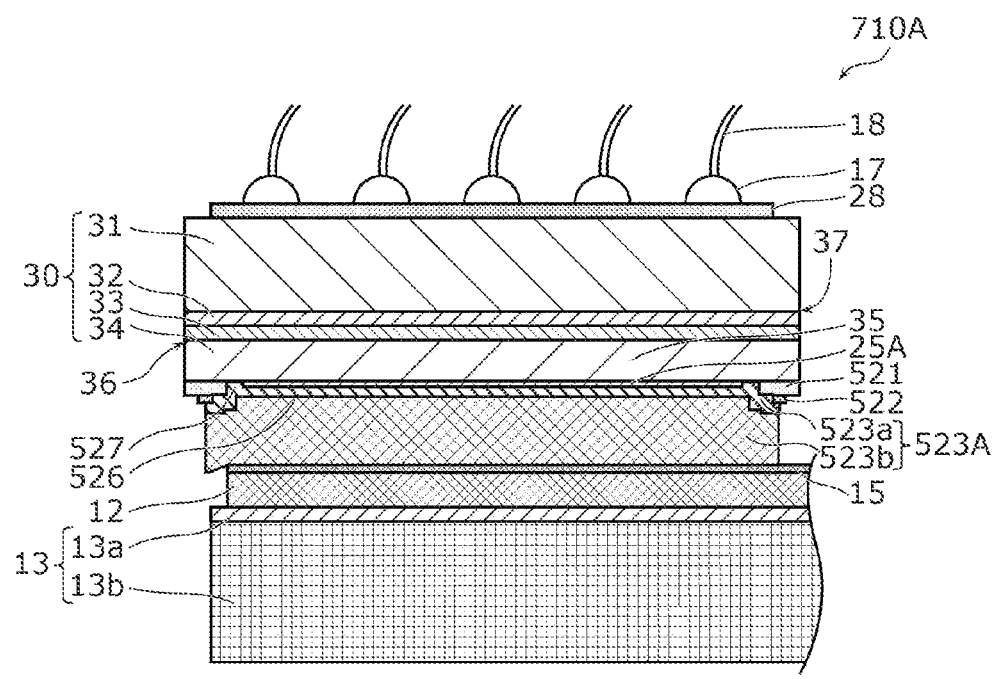
FIG. 11E is a second cross-sectional view schematically illustrating the overall configuration of the semiconductor laser device according to Variation 1 of Embodiment 8.
Figure 11F:
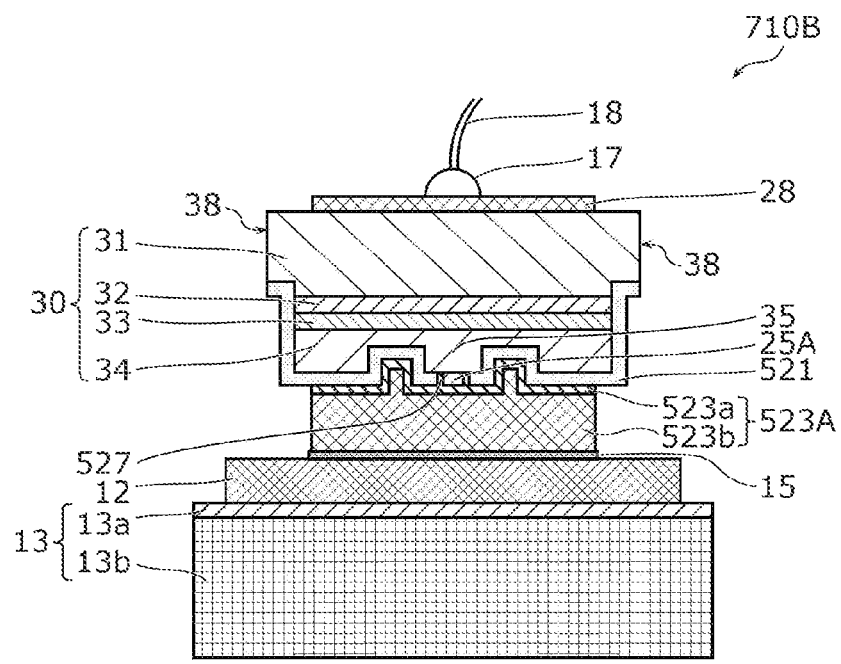
FIG. 11F is a cross-sectional view schematically illustrating an overall configuration of a semiconductor laser device according to Variation 2 of Embodiment 8.

FIG. 11D and FIG. 11E are a first cross-sectional view and a second cross-sectional view, respectively, that schematically illustrate an overall configuration of semiconductor laser device 710A according to Variation 1 of Embodiment 8. FIG. 11F is a cross-sectional view schematically illustrating an overall configuration of semiconductor laser device 710B according to Variation 2 of Embodiment 8. FIG. 11D and FIG. 11F illustrate the same cross section as FIG. 11C. FIG. 11E illustrates the same cross section as FIG. 11B.

As illustrated in FIG. 11D and FIG. 11E, semiconductor laser device 710A according to Variation 1 of Embodiment 8 includes semiconductor laminate body 30, insulating layer 521, first electrode 25A, second electrode 523A, adhesion layer 522, n-side electrode 28, submount 13, solder layer 12, and separating layer 15.

As illustrated in FIG. 11F, semiconductor laser device 710B according to Variation 2 of Embodiment 8 includes semiconductor laminate body 30, insulating layer 521, first electrode 25A, second electrode 523A, n-side electrode 28, submount 13, solder layer 12, and separating layer 15, and does not include adhesion layer 522. Semiconductor laser device 710B according to Variation 2 of Embodiment 8 is also encompassed by the semiconductor laser device according to the present disclosure.

Note that FIG. 11E and FIG. 11F illustrate: wires 18 that are bonded to n-side electrode 28; and metal balls 17 that join wires 18 and n-side electrode 28.

Semiconductor laser device 710A according to Variation 1 of Embodiment 8 is more capable of inhibiting second electrode 523A from peeling than semiconductor laser device 710B according to Variation 2 of Embodiment 8 which does not include adhesion layer 522.

In semiconductor laser device 710A according to Variation 1 of Embodiment 8 and semiconductor laser device 710B according to Variation 2 of Embodiment 8, second electrode 523A includes first conductive film 523a which is formed with a Cr film. With this, when a joining material such as AuSn solder is used as solder layer 12, first conductive film 523a formed with a Cr film functions as a barrier that blocks diffusion of Sn included in the AuSn solder. Accordingly, it is possible to inhibit diffusion of Sn to, for example, adhesion layer 522 of semiconductor laser device 710A and insulating layer 521 of semiconductor laser devices 710A and 710B. Note that even when first conductive film 523a is a layer including a material that contains one of Ni, Ti, W, and Mo instead of the Cr film, first conductive film 523a can function as the barrier.

Variation 3 of Embodiment 8

The following describes a semiconductor laser device according to Variation 3 of Embodiment 8. The semiconductor laser device according to the present variation is different from semiconductor laser device 710A according to Variation 1 of Embodiment 8 in configurations of the first electrode and the second electrode and in that gaps are formed between insulating layer 521 and second electrode 523. Hereinafter, the semiconductor laser device according to the present variation will be described with reference to FIG. 11G, focusing on the differences from semiconductor laser device 710A according to Variation 1 of Embodiment 8.

Figure 11G:
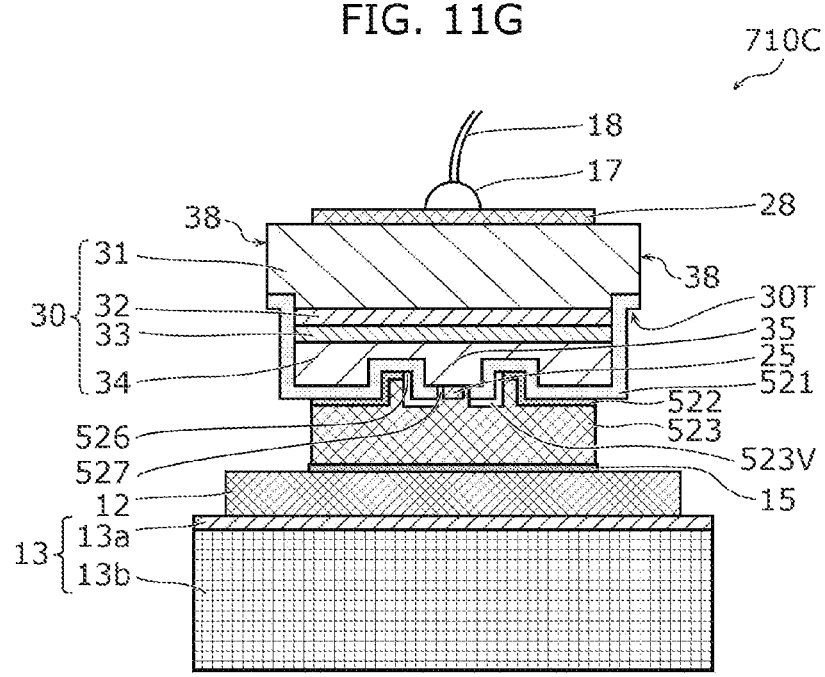
FIG. 11G is a cross-sectional view schematically illustrating an overall configuration of a semiconductor laser device according to Variation 3 of Embodiment 8.

FIG. 11G is a cross-sectional view schematically illustrating an overall configuration of semiconductor laser device 710C according to the present variation. FIG. 11G illustrates the same cross section as FIG. 11C.

As illustrated in FIG. 11G, semiconductor laser device 710C according to the present variation includes semiconductor laminate body 30, insulating layer 521, first electrode 25, second electrode 523, adhesion layer 522, n-side electrode 28, submount 13, solder layer 12, and separating layer 15. Grooves 30T are formed at both side end surfaces 38 of semiconductor laminate body 30 as in semiconductor laser device 510A according to the variation of Embodiment 6.

First electrode 25 and second electrode 523 have the same configurations as first electrode 25 and second electrode 523 of semiconductor laser device 510 according to Embodiment 6.

Gaps 523V are formed in, of the area between insulating layer 521 and second electrode 523 of semiconductor laser device 710C according to the present variation, the regions in which adhesion layer 522 is not present. In other words, in second opening 526, gaps 523V are formed between second electrode 523 and insulating layer 521. When, for example, semiconductor laser device 710C is continuously energized at high temperature, the temperature of the vicinity of ridge portion 35 becomes high, and second electrode 523 could thereby expand. Even in such a case, gaps 523V formed between ridge portion 35 and second electrode 523 make it possible to inhibit ridge portion 35 from being damaged by second electrode 523 which has expanded.

Semiconductor laser device 710C according to the present variation can be manufactured by the following method, for example. First, insulating layer 521, adhesion layer 522, first electrode 25, second electrode 523, and n-side electrode 28 are formed on semiconductor laminate body 30. When doing so, a region in which insulating layer 521 and second electrode 523 come into contact is formed. Subsequently, the portion including semiconductor laminate body 30 is mounted on the portion including submount 13, using solder layer 12. When doing so, heating for melting solder layer 12 is performed for a time period longer than the ordinary heating period. This makes it possible to form gaps 523V in the region in which insulating layer 521 and second electrode 523 come into contact. The heating period required for mounting semiconductor laser device 710C according to the present variation is, for example, approximately four times as much as the heating time required for mounting semiconductor laser device 710A according to Variation 1 of Embodiment 8. Semiconductor laser device 710C according to the present variation can be manufactured in such a manner as described above.

Embodiment 9

The following describes a semiconductor laser device according to Embodiment 9. The semiconductor laser device according to the present embodiment is different from semiconductor laser device 310 according to Embodiment 4 in mainly the configuration of the first electrode. Hereinafter, the semiconductor laser device according to the present embodiment will be described with reference to FIG. 12A to FIG. 12C, focusing on the difference from semiconductor laser device 310 according to Embodiment 4.

Figure 12A:
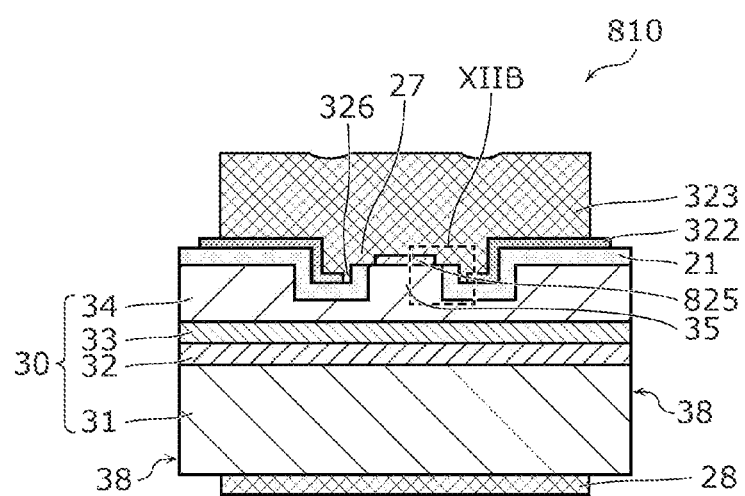
FIG. 12A is a cross-sectional view schematically illustrating an overall configuration of a semiconductor laser device according to Embodiment 9.
Figure 12B:
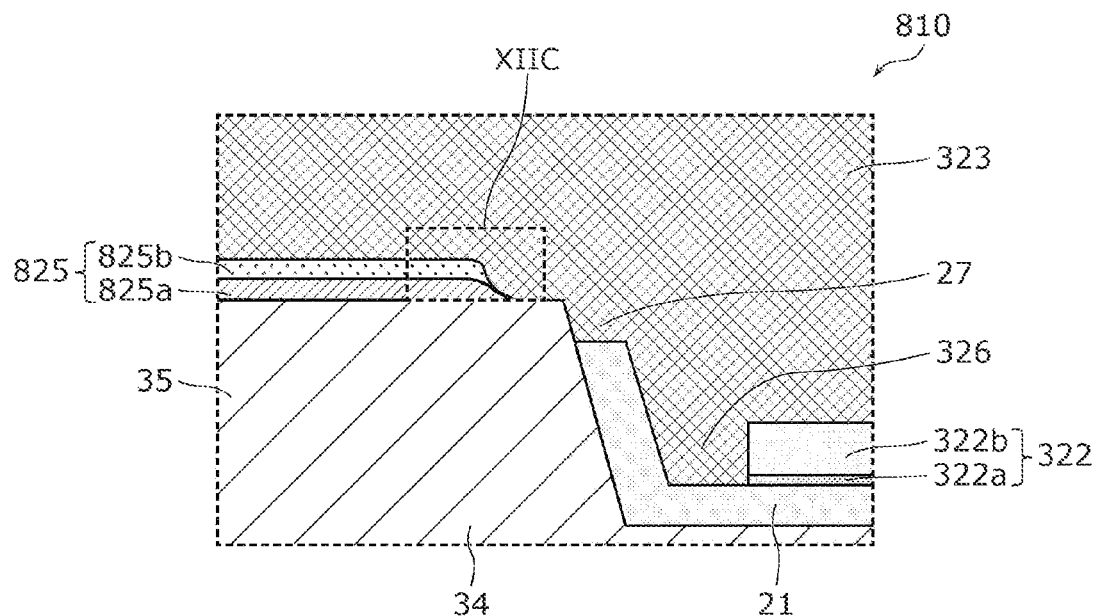
FIG. 12B is a first partially-enlarged cross-sectional view schematically illustrating a configuration of a first electrode included in the semiconductor laser device according to Embodiment 9.
Figure 12C:
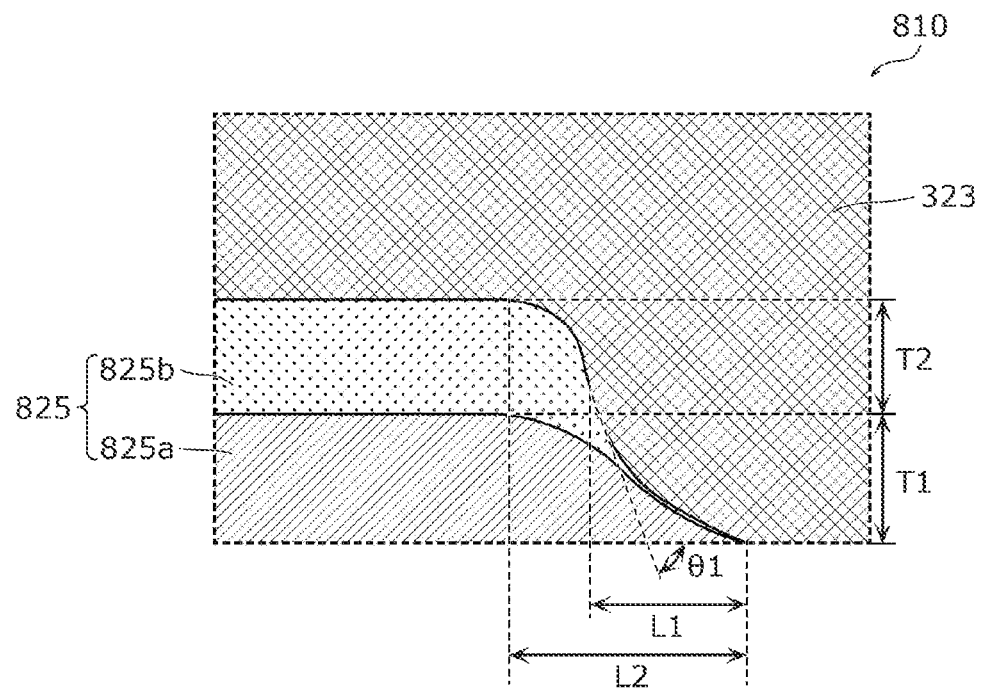
FIG. 12C is a second partially-enlarged cross-sectional view schematically illustrating the configuration of the first electrode included in the semiconductor laser device according to Embodiment 9.

FIG. 12A is a cross-sectional view schematically illustrating an overall configuration of semiconductor laser device 810 according to the present embodiment. FIG. 12B and FIG. 12C are partially-enlarged cross-sectional views schematically illustrating the configuration of first electrode 825 included in semiconductor laser device 810 according to the present embodiment. FIG. 12A illustrates a cross section taken at the same position as the cross section of semiconductor laser device 310 according to Embodiment 4 illustrated in FIG. 7B. FIG. 12B is an enlarged view of the portion in broken-lined frame XIIB shown in the cross-sectional view illustrated in FIG. 12A. FIG. 12C is an enlarged view of the portion in broken-lined frame XIIC shown in the enlarged cross-sectional view illustrated in FIG. 12B.

As illustrated in FIG. 12A, semiconductor laser device 810 according to the present embodiment includes semiconductor laminate body 30, insulating layer 21, first electrode 825, second electrode 323, adhesion layer 322, and n-side electrode 28.

In the present embodiment, insulating layer 21 includes $SiO_2$ having a thickness of 300 nm. Adhesion layer 322 includes first layer 322a and second layer 322b in the stated order from the insulating layer 21 side. First layer 322a includes Ti having a thickness of 10 nm, and second layer 322b includes Pt having a thickness of 50 nm.

As illustrated in FIG. 12B, first electrode 825 is disposed on the upper surface of ridge portion 35, and includes lower layer electrode 825a and upper layer electrode 825b. Of these layers of first electrode 825, lower layer electrode 825a is a layer disposed in a position closer to semiconductor laminate body 30. In the present embodiment, lower layer electrode 825a includes Pd. Thickness T1 of lower layer electrode 825a is 40 nm. Of the layers of first electrode 825, upper layer electrode 825b is a layer disposed in a position farther from semiconductor laminate body 30. In the present embodiment, upper layer electrode 825b includes Pt. Thickness T2 of upper layer electrode 825b is 35 nm. Note that first electrode 825 is covered with second electrode 323 that includes Au having a thickness of approximately 1.6 μm.

In the present embodiment, as illustrated in FIG. 12B and FIG. 12C, the cross section of an end portion of first electrode 825 is sloped and has a straight portion between the corner and the end. The slope becomes gentle toward the end. The corner in the cross section of the end portion of first electrode 825 is not sharp (that is, it has a finite curvature). In the present embodiment, maximum slope angle θ1 of the end portion of first electrode 825 is 72 degrees. Note that maximum slope angle θ1 is not limited to 72 degrees. Maximum slope angle θ1 may be at least 45 degrees and at most 85 degrees. Maximum slope angle θ1 is defined as an angle formed between (i) the straight portion between the upper surface and the lowermost end of upper layer electrode 825b (that is, the portion including the inflection point of the sloped surface) and (ii) the upper surface of ridge portion 35.

As illustrated in FIG. 12C, the end portion of first electrode 825 has a foot portion, and length L1 of the foot portion is 28 nm in the present embodiment. Length L1 of the foot portion is defined as the length between the portion where the slope of the straight portion of the sloped surface starts to continuously become gentle and the region in which the thickness is zero.

Length L2 of the sloped portion in the end portion of first electrode 825 is 45 nm. Here, the sloped portion is defined as the length between the end of a flat region of the upper surface of first electrode 825 and the region in which thickness is zero. Note that here, the flat region of the upper surface of first electrode 825 is not limited to the region in which the upper surface is completely flat, and also includes a region in which the upper surface is substantially flat. For example, the flat region may be defined as a region in which the amount of change in thickness is at most 10%. Also, the region in which the thickness is zero is not limited to the region in which the thickness is completely zero, and also includes a region in which the thickness is substantially zero. For example, the region in which the thickness is zero may be defined as a region in which the thickness is at most 5% of the maximum thickness.

Semiconductor laser device 810 having the above-described configuration is suitable for junction-up mounting. For example, when semiconductor laser device 810 is to be junction-down mounted to the submount, there is a need to increase the thickness of upper layer electrode 825b including Pt, in order to inhibit diffusion, toward semiconductor laminate body 30, of solder that includes AuSn etc. and is disposed on the submount. On the other hand, when semiconductor laser device 810 is to be junction-up mounted, there is no such a need to increase the thickness of upper layer electrode 825b, and it is thus possible to use upper layer electrode 825b that is relatively thin as described above. This way, the cost of semiconductor laser device 810 can be reduced.

Embodiment 10

The following describes a semiconductor laser device according to Embodiment 10. The semiconductor laser device according to the present embodiment is different from semiconductor laser device 810 according to Embodiment 9 in mainly the configuration of the first electrode. Hereinafter, the semiconductor laser device according to the present embodiment will be described with reference to FIG. 13A and FIG. 13B, focusing on the difference from semiconductor laser device 810 according to Embodiment 9.

Figure 13A:
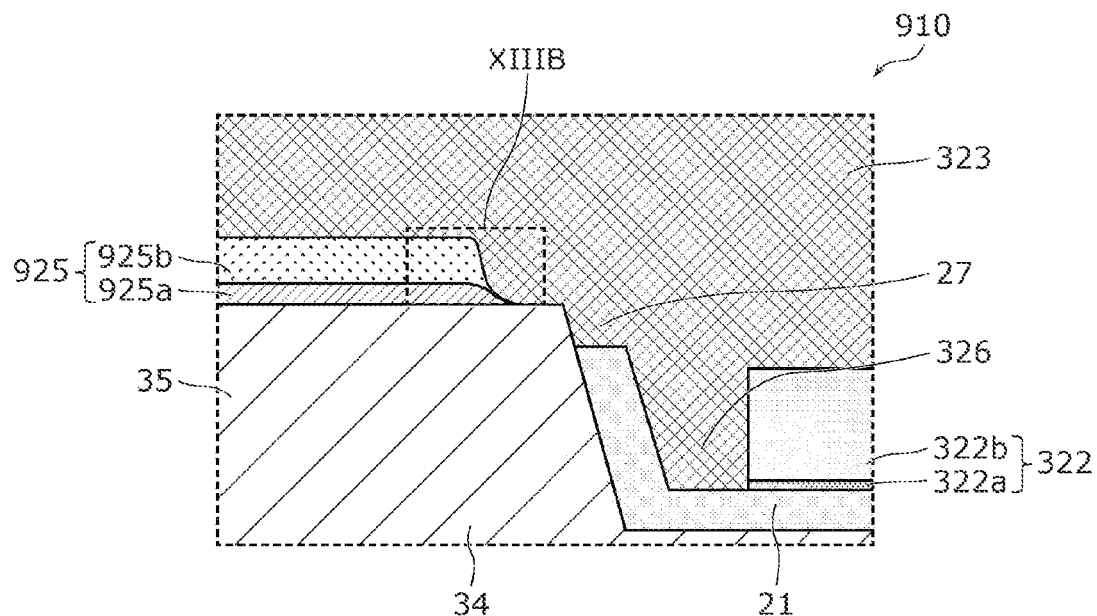
FIG. 13A is a first partially-enlarged cross-sectional view schematically illustrating a configuration of a first electrode included in a semiconductor laser device according to Embodiment 10.
Figure 13B:
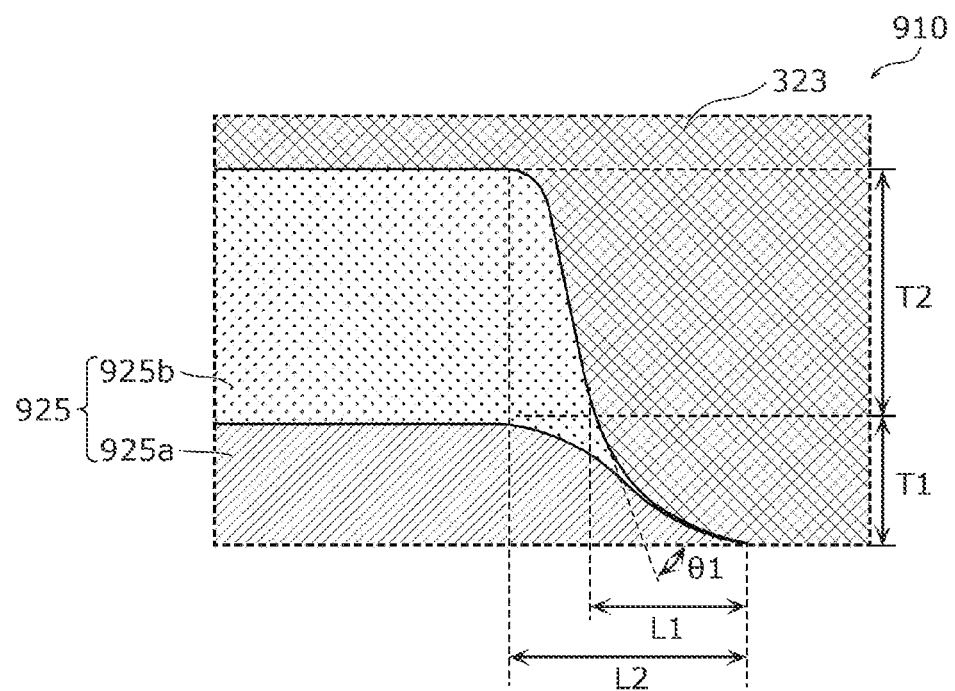
FIG. 13B is a second partially-enlarged cross-sectional view schematically illustrating the configuration of the first electrode included in the semiconductor laser device according to Embodiment 10.

FIG. 13A and FIG. 13B are partially-enlarged cross-sectional views schematically illustrating the configuration of first electrode 925 included in semiconductor laser device 910 according to the present embodiment. FIG. 13A illustrates a cross section taken at the same position as the cross section of semiconductor laser device 810 according to Embodiment 9 illustrated in FIG. 12B. FIG. 13B is an enlarged view of the portion in broken-lined frame XIIIB shown in the enlarged cross-sectional view illustrated in FIG. 13A.

As with semiconductor laser device 810 according to Embodiment 9, semiconductor laser device 910 according to the present embodiment includes semiconductor laminate body 30, insulating layer 21, first electrode 925, second electrode 323, adhesion layer 322, and n-side electrode 28.

As illustrated in FIG. 13A, first electrode 925 is disposed on the upper surface of ridge portion 35, and includes lower layer electrode 925a and upper layer electrode 925b. Of these layers of first electrode 925, lower layer electrode 925a is a layer disposed in a position closer to semiconductor laminate body 30. In the present embodiment, lower layer electrode 925a includes Pd. Thickness T1 of lower layer electrode 925a is 40 nm. Of the layers of first electrode 925, upper layer electrode 925b is a layer disposed in a position farther from semiconductor laminate body 30. In the present embodiment, upper layer electrode 925b includes Pt. Thickness T2 of upper layer electrode 925b is 100 nm. Note that first electrode 925 is covered with second electrode 323 that includes Au having a thickness of approximately 2.0 μm.

In the present embodiment, as illustrated in FIG. 13A and FIG. 13B, the cross section of an end portion of first electrode 925 is sloped and has a straight portion between the corner and the end. The slope becomes gentle toward the end. The corner in the cross section of the end portion of first electrode 925 is not sharp (that is, it has a finite curvature). In the present embodiment, maximum slope angle θ1 of the end portion of first electrode 925 is 72 degrees. Note that maximum slope angle θ1 is not limited to 72 degrees. Maximum slope angle θ1 may be at least 45 degrees and at most 85 degrees.

As illustrated in FIG. 13B, the end portion of first electrode 925 has a foot portion, and length L1 of the foot portion is 28 nm in the present embodiment.

Length L2 of the sloped portion in the end portion of first electrode 925 is 45 nm. Here, the definition of the sloped portion is as described in Embodiment 9.

Semiconductor laser device 910 having the above-described configuration is suitable for junction-down mounting. With semiconductor laser device 910, the thickness of upper layer electrode 925b including Pt is increased, thus making it possible, when semiconductor laser device 910 is to be junction-down mounted to the submount, to inhibit diffusion, toward semiconductor laminate body 30, of solder that includes AuSn etc. and is disposed on the submount. To inhibit diffusion of the solder toward semiconductor laminate body 30, thickness T2 of upper layer electrode 925b including Pt may be, for example, at least 50 nm and less than 200 nm.

Variations etc.

While the semiconductor laser device according to the present disclosure has been described above based on each embodiment, the present disclosure is not limited to these embodiments.

For example, although the first electrode is not covered with the adhesion layer in the above embodiments, the first electrode may be partially covered with the adhesion layer.

Further, although the second electrode is not disposed above the front end surface or the rear end surface in the above embodiments, the second electrode may be disposed above at least one of the front end surface or the rear end surface. Even with such a configuration, it is still possible to inhibit peeling of the second electrode by disposing the second electrode and the adhesion layer above the insulating layer between the first opening and at least one of the front end surface or the rear end surface.

Furthermore, the present disclosure encompasses: embodiments achieved by making various modifications conceivable to a person skilled in the art to each of the above embodiments; and embodiments realized by arbitrarily combining constituent elements and functions in the above embodiments without departing from the essence of the present disclosure.

For example, the configuration of first electrode 825 included in semiconductor laser device 810 according to Embodiment 9 is applicable to each semiconductor laser device according to Embodiments 1 to 6. This makes it possible to realize a semiconductor laser device suitable for junction-up mounting.

For example, the configuration of first electrode 925 included in semiconductor laser device 910 according to Embodiment 10 is applicable to each semiconductor laser device according to Embodiments 1 to 8. This makes it possible to realize a semiconductor laser device suitable for junction-down mounting.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser device according to the present disclosure is useful particularly in, for example, light sources for headlights which need to be highly reliable.

The invention claimed is:

1. A semiconductor laser device that emits laser light, the semiconductor laser device comprising:
    a semiconductor laminate body including an active layer that generates the laser light;
    an insulating layer disposed above the semiconductor laminate body;
    a first electrode disposed above the semiconductor laminate body;
    a second electrode disposed above the first electrode and the insulating layer; and
    an adhesion layer disposed between the second electrode and the insulating layer, wherein:
    the semiconductor laminate body includes a front end surface through which the laser light is emitted, and a rear end surface opposite the front end surface,
    the insulating layer includes a first opening extending in a first direction that is a direction from the front end surface toward the rear end surface,
    the adhesion layer includes a second opening that at least partially overlaps with the first opening in a plan view of the adhesion layer,
    the first electrode is at least partially disposed inside the first opening and the second opening in the plan view of the adhesion layer,
    the second electrode and the adhesion layer are disposed above the insulating layer between the first opening and at least one of the front end surface or the rear end surface, and
    in the plan view of the adhesion layer, a perimeter of the second electrode is at least partially located inward of a perimeter of the adhesion layer.

2. The semiconductor laser device according to claim 1, wherein
    the second electrode does not include Ti.

3. The semiconductor laser device according to claim 1, wherein
    an electrical conductivity of the second electrode is greater than an electrical conductivity of the adhesion layer.

4. The semiconductor laser device according to claim 1, wherein
    the second electrode is in contact with the first electrode.

5. The semiconductor laser device according to claim 1, wherein
    the second electrode is not in contact with the at least one of the front end surface or the rear end surface.

6. The semiconductor laser device according to claim 1, wherein
    in the plan view of the adhesion layer, the perimeter of the second electrode is at least partially located outside a perimeter of the first opening and a perimeter of the second opening.

7. The semiconductor laser device according to claim 1, wherein
    in the plan view of the adhesion layer, an edge of the second opening adjacent to one end surface among the front end surface and the rear end surface is located between the one end surface and an edge of the first opening adjacent to the one end surface.

8. The semiconductor laser device according to claim 1, wherein
    in the plan view of the adhesion layer, an edge of the second opening adjacent to a side end surface of the semiconductor laminate body in a second direction is located between the side end surface and an edge of the first opening adjacent to the side end surface, the second direction being perpendicular to the first direction.

9. The semiconductor laser device according to claim 1, wherein
    the semiconductor laminate body includes a ridge portion, and
    a perimeter of the first opening is located on an upper surface of the ridge portion and at a distance of at least 0.5 μm and less than 2.0 μm from a position at which the upper surface and a side surface of the ridge portion come into contact.

10. The semiconductor laser device according to claim 1, wherein
    the semiconductor laminate body includes a ridge portion, and
    the following expression holds:

$$19°<\arctan(Hr/Wi)\times180/\pi<54°$$

where Wi denotes a distance from the first electrode to a position where a side surface and an upper surface of the ridge portion come into contact, and Hr denotes a height of the ridge portion.

11. The semiconductor laser device according to claim 1, wherein
    in the plan view of the adhesion layer, all edges of the second opening are located outside the first opening.

12. The semiconductor laser device according to claim 1, wherein
    in the plan view of the adhesion layer, each of edges of the second opening is located (i) inside a perimeter of the first opening or (ii) on the perimeter of the first opening.

13. The semiconductor laser device according to claim 1, wherein
    in the second opening, a gap is formed between the second electrode and the insulating layer.

14. The semiconductor laser device according to claim 1, wherein
the adhesion layer includes at least one of Ti or Cr.

15. The semiconductor laser device according to claim 1, wherein
the semiconductor laminate body includes a p-type semiconductor layer disposed between the active layer and the first electrode.

16. The semiconductor laser device according to claim 1, wherein
the first electrode does not include Ti.

17. The semiconductor laser device according to claim 1, wherein
an electrical conductivity of the first electrode is greater than an electrical conductivity of the adhesion layer.

18. The semiconductor laser device according to claim 1, wherein
the first electrode is an ohmic electrode.

19. The semiconductor laser device according to claim 1, wherein
the first electrode includes at least one of Pd, Pt, Ni, or Al.

20. The semiconductor laser device according to claim 1, wherein
the adhesion layer is not in contact with the first electrode.

21. The semiconductor laser device according to claim 1, wherein
the semiconductor laminate body includes a ridge portion, and
in the plan view of the adhesion layer, an upper surface of the ridge portion is at least partially disposed inside the first opening.

22. The semiconductor laser device according to claim 1, wherein
the second electrode is a pad electrode.

23. The semiconductor laser device according to claim 1, further comprising:
a submount joined to the second electrode.

24. The semiconductor laser device according to claim 23, wherein
the second electrode includes an alloy containing Au.

25. The semiconductor laser device according to claim 24, wherein
the second electrode includes a barrier layer disposed on a surface of the second electrode facing the semiconductor laminate body.

26. The semiconductor laser device according to claim 25, wherein
the barrier layer includes a material containing one of Cr, Ni, Ti, W, and Mo.

27. The semiconductor laser device according to claim 23, wherein
the submount includes an end surface intersecting with the first direction, and
in the plan view of the adhesion layer, the end surface is located between the front end surface and the first opening.

28. A semiconductor laser device that emits laser light, the semiconductor laser device comprising:
a semiconductor laminate body including an active layer that generates the laser light;
an insulating layer disposed above the semiconductor laminate body;
a first electrode disposed above the semiconductor laminate body;
a second electrode disposed above the first electrode and the insulating layer; and
an adhesion layer disposed between the second electrode and the insulating layer, wherein:
the semiconductor laminate body includes a front end surface through which the laser light is emitted, and a rear end surface opposite the front end surface,
the insulating layer includes a first opening extending in a first direction that is a direction from the front end surface toward the rear end surface,
the adhesion layer includes a second opening that at least partially overlaps with the first opening in a plan view of the adhesion layer,
the first electrode is at least partially disposed inside the first opening and the second opening in the plan view of the adhesion layer,
the second electrode and the adhesion layer are disposed above the insulating layer between the first opening and at least one of the front end surface or the rear end surface,
the semiconductor laminate body includes a ridge portion, and
a perimeter of the first opening is located on an upper surface of the ridge portion and at a distance of at least 0.5 μm and less than 2.0 μm from a position at which the upper surface and a side surface of the ridge portion come into contact.

29. A semiconductor laser device that emits laser light, the semiconductor laser device comprising:
a semiconductor laminate body including an active layer that generates the laser light;
an insulating layer disposed above the semiconductor laminate body;
a first electrode disposed above the semiconductor laminate body;
a second electrode disposed above the first electrode and the insulating layer; and
an adhesion layer disposed between the second electrode and the insulating layer, wherein:
the semiconductor laminate body includes a front end surface through which the laser light is emitted, and a rear end surface opposite the front end surface,
the insulating layer includes a first opening extending in a first direction that is a direction from the front end surface toward the rear end surface,
the adhesion layer includes a second opening that at least partially overlaps with the first opening in a plan view of the adhesion layer,
the first electrode is at least partially disposed inside the first opening and the second opening in the plan view of the adhesion layer,
the second electrode and the adhesion layer are disposed above the insulating layer between the first opening and at least one of the front end surface or the rear end surface,
the semiconductor laminate body includes a ridge portion, and
the following expression holds:

$$19° < \arctan(Hr/Wi) \times 180/\pi < 54°$$

where Wi denotes a distance from the first electrode to a position where a side surface and an upper surface of the ridge portion come into contact, and Hr denotes a height of the ridge portion.

* * * * *